(12) United States Patent
Takahashi et al.

(10) Patent No.: US 10,741,233 B2
(45) Date of Patent: Aug. 11, 2020

(54) SEMICONDUCTOR MEMORY DEVICE

(71) Applicant: TOSHIBA MEMORY CORPORATION, Tokyo (JP)

(72) Inventors: Masahiro Takahashi, Yokohama Kanagawa (JP); Ryousuke Takizawa, Naka Kanagawa (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 15/906,621

(22) Filed: Feb. 27, 2018

(65) Prior Publication Data
US 2019/0080740 A1    Mar. 14, 2019

(30) Foreign Application Priority Data
Sep. 13, 2017    (JP) .................. 2017-175899

(51) Int. Cl.
| G11C 11/16 | (2006.01) |
| G11C 29/02 | (2006.01) |
| G11C 29/12 | (2006.01) |
| G11C 5/14  | (2006.01) |
| G11C 7/04  | (2006.01) |

(52) U.S. Cl.
CPC .......... *G11C 11/1675* (2013.01); *G11C 5/144* (2013.01); *G11C 11/1673* (2013.01); *G11C 11/1697* (2013.01); *G11C 29/021* (2013.01); *G11C 29/028* (2013.01); *G11C 29/12005* (2013.01); *G11C 7/04* (2013.01); *G11C 11/161* (2013.01); *G11C 11/1693* (2013.01)

(58) Field of Classification Search
CPC .............. G11C 11/1675; G11C 11/161; G11C 11/1673; G11C 11/1967
USPC .................................. 365/158, 148
See application file for complete search history.

(56) References Cited

U.S. PATENT DOCUMENTS

| 6,747,891 B2 | 6/2004 | Hoffmann et al. |
| 8,009,484 B2 | 8/2011 | Furuta et al. |
| 9,025,364 B2 | 5/2015 | Kinney et al. |
| 9,466,363 B2 | 10/2016 | Endoh et al. |
| 2009/0027975 A1* | 1/2009 | Kang .................. G11C 11/5678 365/189.09 |
| 2010/0110793 A1* | 5/2010 | Kim ........................ G11C 5/143 365/185.18 |
| 2010/0309716 A1* | 12/2010 | Tsukada ................. G11C 5/145 365/163 |
| 2014/0157065 A1 | 6/2014 | Ong |
| 2016/0276009 A1 | 9/2016 | Lee et al. |

FOREIGN PATENT DOCUMENTS

| JP | 2010055692 A | 3/2010 |
| WO | 2013099536 A1 | 7/2013 |

* cited by examiner

*Primary Examiner* — Anthan Tran
(74) *Attorney, Agent, or Firm* — Kim & Stewart LLP

(57) ABSTRACT

A semiconductor memory device comprises a first memory cell with a first variable resistance element. A first write controller is configured to write data into the first memory cell using a first voltage that is supplied via a first wiring. A second write controller configured to write data into the first memory cell using a second voltage that is lower than the first voltage when the first voltage supplied via the first wiring is reduced below a threshold level.

17 Claims, 27 Drawing Sheets

Write current

Parallel state (low resistance)

Write current

Anti-parallel state (high resistance)

AT HIGH TEMPERATURE

AT LOW TEMPERATURE

SEMICONDUCTOR MEMORY DEVICE

CROSS-REFERENCE TO RELATED APPLICATION

This application is based upon and claims the benefit of priority from Japanese Patent Application No. 2017-175899, filed Sep. 13, 2017, the entire contents of which are incorporated herein by reference.

FIELD

Embodiments described herein relate generally to a semiconductor memory device.

BACKGROUND

A magnetic random access memory (MRAM) is a memory device using a memory element relying on a magneto-resistive phenomenon for storing information within a memory cell. The MRAM is attracting attention for next generation memory device applications due to high speed operation, a large capacity, and non-volatility.

DETAILED DESCRIPTION

Figure 1:
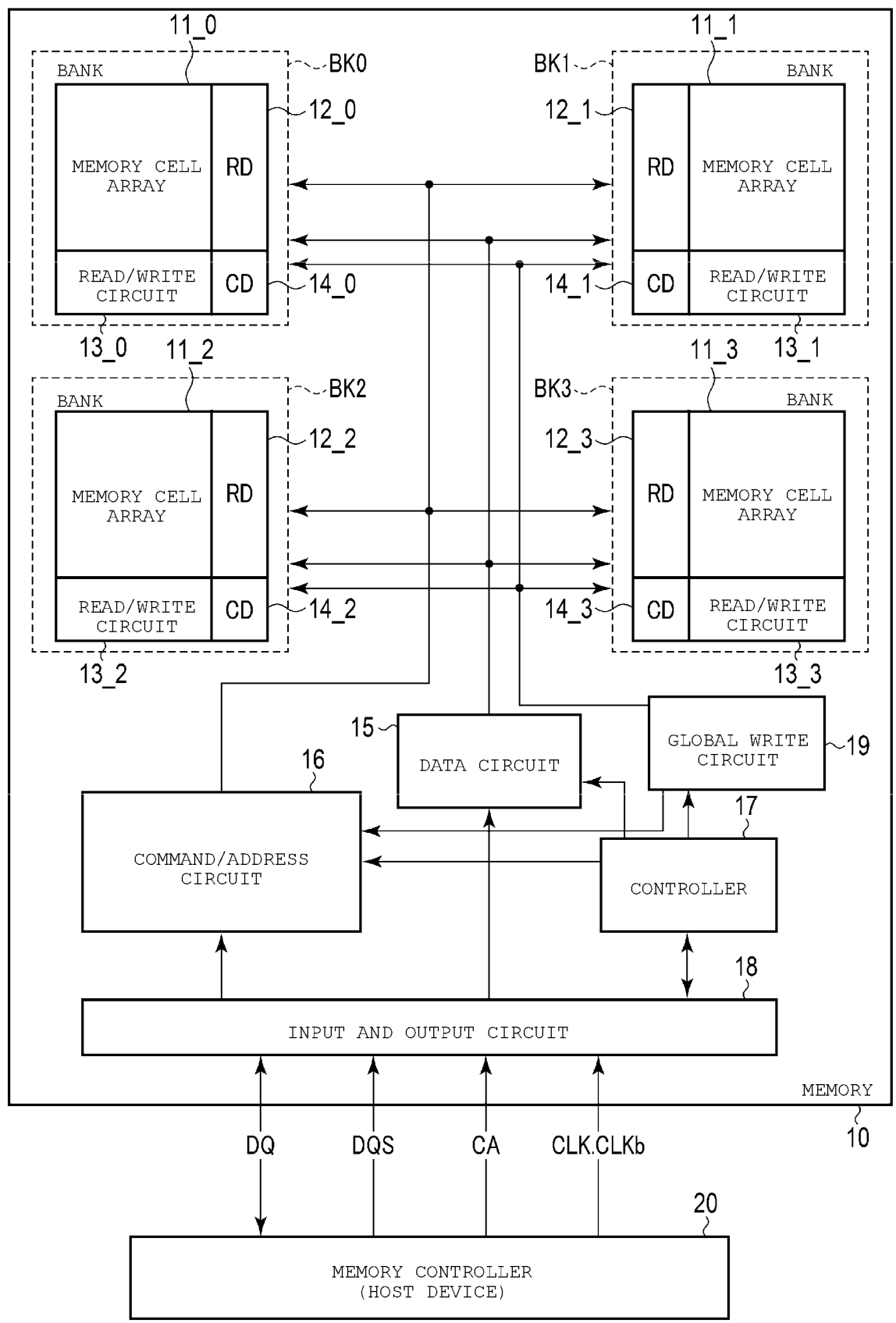
FIG. 1 is a block diagram illustrating aspects of a semiconductor memory device according to a first embodiment.

In general, according to one embodiment, a semiconductor memory device comprises a first memory cell with a first variable resistance element, a first write controller configured to write data into the first memory cell using a first voltage that is supplied via a first wiring, and a second write controller configured to write data into the first memory cell using a second voltage that is lower than the first voltage when the first voltage supplied via the first wiring is reduced below a threshold level.

Embodiments will be described below with reference to the drawings. In the drawings, the same reference numerals are given to the same portions.

First Embodiment

A semiconductor memory device according to a first embodiment will be described below with reference to FIGS. 1 to 9. Hereinafter, an MRAM that stores data using a magnetic tunnel junction (MTJ) element as a variable resistance element will be described as an example, but is not limited thereto. The first embodiment is applicable to the any memory type which senses a resistance difference in a variable resistance element by converting the resistance difference into a current difference or a voltage difference.

In the following description, unless otherwise specified, the term "connection" or phrase "connected to" includes not only direct connection but also connection via one or more additional elements. In the following description, a "first terminal" of a transistor corresponds to one of a source or a drain terminal and a "second terminal" of the transistor corresponds to the other of the source and the drain terminal. Additionally, a "control terminal" of the transistor indicates a gate terminal or the like. In the description, the notation "signalb" indicates an inverted signal of the "signal," as in the signal "clock CLKb" is an inversion of the signal "clock CLK."

First Embodiment

FIG. 1 is a block diagram illustrating the overall configuration of a semiconductor memory device according to the first embodiment.

As illustrated in FIG. 1, the semiconductor memory device includes a memory 10 and a memory controller 20, which may be a host device connected to the memory 10.

The memory 10 is, for example, the MRAM, a dynamic random access memory (DRAM), a resistive random access memory (ReRAM), and a phase-change random access memory (PCRAM). Hereinafter, a case where the memory 10 is the MRAM will be described.

The memory 10 receives a command/address signal CA, data DQ, a data strobe signal DQS, and a clock CLK/CLKb from the memory controller 20. The memory 10 transmits data DQ to the memory controller 20.

The memory controller 20 includes elements such as a central processing unit (CPU), a RAM, a read only memory (ROM), and the like. The memory controller 20 controls the memory 10 by issuing a command or commands.

The memory 10 includes a bank BK (for example, bank BK0, bank BK1, bank BK2, and bank BK3), a data circuit 15, a command/address circuit 16, a controller 17, an input and output (I/O) circuit 18, and a global write circuit 19.

The bank BK0 includes a memory cell array 11_0, a row decoder 12_0, a read/write circuit 13_0, and a column decoder 14_0. The other banks BK1 to BK3 have the same configuration as that of the bank BK0, respectively, that is, the other banks BK include each of memory cell arrays 11_1 to 11_3, each of row decoders 12_1 to 12_3, each of read/write circuits 13_1 to 13_3, and each of column decoders 14_1 to 14_3, respectively. Hereinafter, a configuration of the bank BK0 will be described as an example. Here, the bank BK is the largest activation unit selectable by the memory controller 20.

Figure 2:
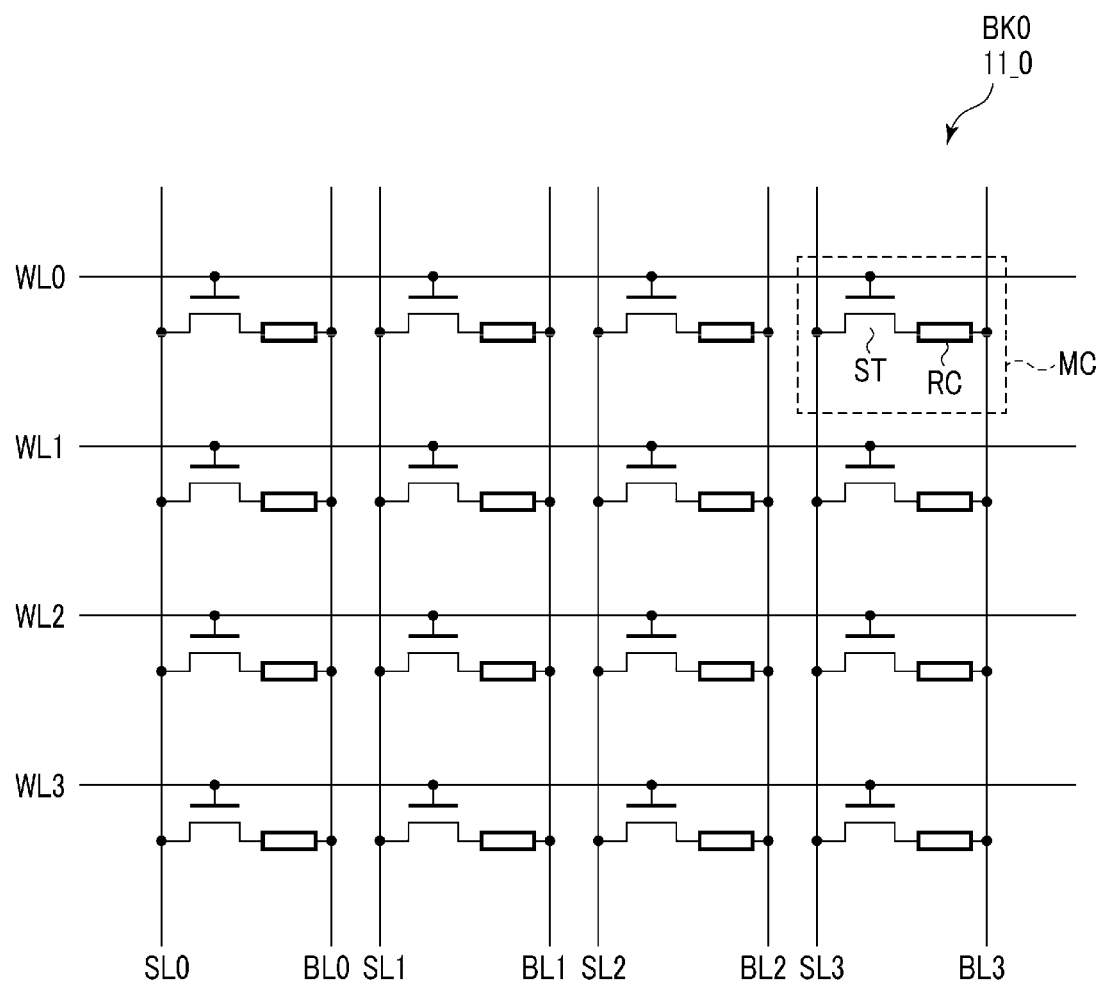
FIG. 2 is a diagram illustrating aspects of a memory cell array of the semiconductor memory device according to the first embodiment.

FIG. 2 is a diagram illustrating the memory cell array 11_0 of the semiconductor memory device according to the first embodiment.

As illustrated in FIG. 2, a bit line BL (bit lines BL0 to BL3), a source line SL (source lines SL0 to SL3), and a word line WL (word line WL0 to WL3) are provided in the memory cell array 11_0 of bank BK0. The bit lines BL and the source lines SL extend in the first direction and are alternately provided in a second direction orthogonal to the first direction. The word lines WL extend in the second direction. The memory cell arrays 11 have a plurality of memory cells MC. Each memory cell MC is provided at each of crossing positions between a bit line BL and a source line SL and the word line WL. Thus, the plurality of memory cells MC are arranged in a matrix in the first direction and the second direction. A set of memory cells MC connected to one word line WL is referred to as a "page".

The number of the bit lines BL, the source lines SL, and the word lines WL in the memory cell array 11_0 is an example, and is not a limitation.

The memory cell MC includes, for example, a variable resistance element RC and a select transistor ST. A first terminal of the variable resistance element RC is electrically connected to the bit line BL and a second terminal thereof is electrically connected to a first terminal of the select transistor ST. A second terminal of the select transistor ST is electrically connected to the source line SL and a control terminal of the select transistor ST is electrically connected to the word line WL.

The variable resistance element RC is an element for which a resistance value changes by application of a current (or voltage). The variable resistance element RC includes, for example, an MTJ element, a phase-change element, a ferroelectric element, and the like. The memory cell MC is selected by the select transistor ST being turned ON by a word line WL. Here, a case where a MRAM device will be described as an example, that is, the variable resistance element RC is a MTJ element in this example.

Figure 3A:
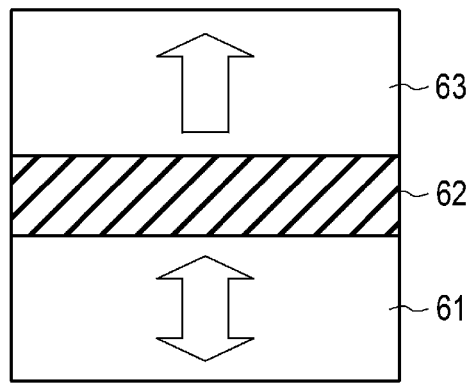
FIG. 3A depicts a schematic configuration of a variable resistance element in the semiconductor memory device according to the first embodiment.

FIG. 3A is a cross-sectional view illustrating a schematic configuration of the variable resistance element RC in the semiconductor memory device according to the first embodiment. Here, a storage layer 61, a tunnel barrier layer 62, and a reference layer 63 are illustrated as the main components of a variable resistance element RC, though other components may be included in some embodiments.

As illustrated in FIG. 3A, the variable resistance element RC includes a stacked body configured with the storage layer 61, which is a ferromagnetic layer, the reference layer 63 which is a ferromagnetic layer, and the tunnel barrier layer 62 which is a nonmagnetic layer formed between and the layers 61 and 63.

The storage layer 61 is a ferromagnetic layer having a magnetization direction that is variable and has perpendicular magnetic anisotropy that is perpendicular or substantially perpendicular to a film surface (upper surface/lower surface). Here, the expression of "magnetization direction is variable" indicates that the magnetization direction changes with respect to a predetermined write current. The expression of "substantially perpendicular" means that the direction of residual magnetization falls within a range of $45°≤θ≤90°$ with respect to the film surface. The storage layer 61 is made of, for example, cobalt iron boron (CoFeB) or iron boride (FeB).

The tunnel barrier layer 62 is formed on the storage layer 61. The tunnel barrier layer 62 is a nonmagnetic layer and is made of, for example, magnesium oxide (MgO).

The reference layer 63 is formed on the tunnel barrier layer 62. The reference layer 63 is a ferromagnetic layer of which the magnetization direction is invariable and has perpendicular magnetic anisotropy that is perpendicular or substantially perpendicular to the film surface. Here, the expression of "magnetization direction is invariable" indicates that the magnetization direction does not change with respect to a predetermined write current. That is, the reference layer 63 has an inversion energy barrier of the magnetization direction larger than that of the storage layer 61. The reference layer 63 is made of, for example, cobalt platinum (CoPt), cobalt nickel (CoNi), or cobalt palladium (CoPd).

Figure 3B:
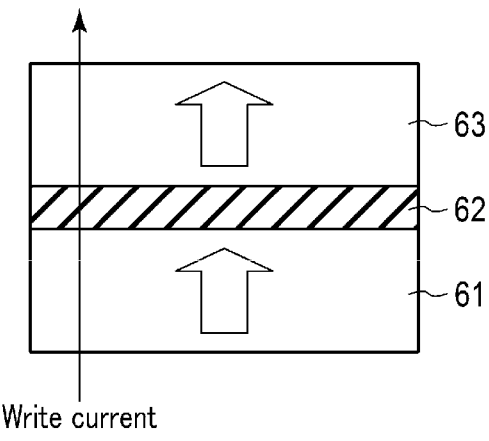
FIG. 3B is a view relating aspects of data writing in a variable resistance element and depicts the variable resistance element in a so called parallel state (P state).
Figure 3C:
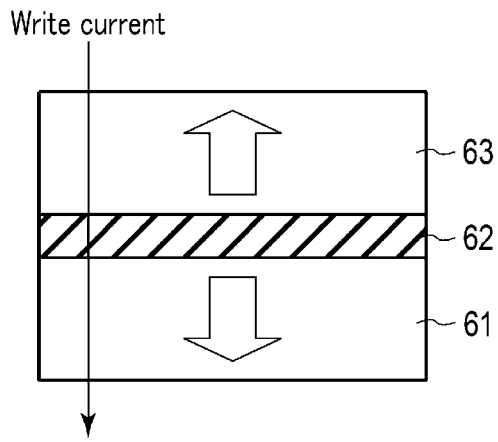
FIG. 3C is a view relating aspects of data writing in a variable resistance element and depicts the variable resistance element in a so called antiparallel state (AP state).

FIG. 3B is a view for explaining write for the variable resistance element RC in the semiconductor memory device according to the first embodiment and illustrates a cross-sectional view of the variable resistance element in a parallel state (P state). FIG. 3C is a view for explaining write for the variable resistance element RC in the semiconductor memory device according to the first embodiment and illustrates a cross-sectional view of the variable resistance element in an antiparallel state (AP state).

The variable resistance element RC is, for example, a spin injection type variable resistance element. Accordingly, in a case where data is written into the variable resistance element RC or in a case where data is read from the variable resistance element RC, a current is bidirectionally supplied to the variable resistance element RC in a direction perpendicular to the film surface.

More specifically, write of data into the variable resistance element RC is performed as follows.

As illustrated in FIG. 3B, in a case where the current flows from the storage layer 61 to the reference layer 63, that is, in a case where electrons are supplied from the reference layer 63 toward the storage layer 61, spin-polarized electrons in the same direction as the magnetization direction of the reference layer 63 are injected into the storage layer 61. In this case, the magnetization direction of the storage layer 61 is aligned in the same direction as the magnetization direction of the reference layer 63. With this, the magnetization direction of the reference layer 63 and the magnetization direction of the storage layer 61 become parallel arrangement. In this parallel state, the resistance value of the variable resistance element RC becomes the smallest. This case is defined as data of "0", for example.

On the other hand, as illustrated in FIG. 3C, in a case where a current flows from the reference layer 63 to the storage layer 61, that is, in a case where electrons are supplied from the storage layer 61 toward the reference layer 63, the electrons are reflected by the reference layer 63 so that spin-polarized electrons in the direction opposite to the magnetization direction of the reference layer 63 are injected into the storage layer 61. In this case, the magnetization direction of the storage layer 61 is aligned in the direction opposite to the magnetization direction of the reference layer 63. With this, the magnetization direction of the reference layer 63 and the magnetization direction of the storage layer 61 become anti-parallel arrangement. In this antiparallel state, the resistance value of the variable resistance element RC becomes the largest. This case is defined as data of "1", for example.

Data read from the variable resistance element RC is performed as follows.

A read current is supplied to the variable resistance element RC. The read current is set to a value that is generally smaller than that of the write current and is at level at which the magnetization direction of the storage layer 61 is not reversed. By detecting a change in the resistance value of the variable resistance element RC at that time, data of "0" and data of "1" data can be read.

As illustrated in FIG. 1, again, the row decoder 12_0 selects the word line WL according to a row address. The column decoder 14_0 selects the bit line BL and the source line SL according to a column address. The read/write circuit 13_0 includes a write driver, a sense amplifier, and the like, and controls data writing into and data reading from the memory cell array 11_0.

The input and output circuit 18 controls transfer of a signal to and from the memory controller 20. More specifically, the input and output circuit 18 receives the command/address signal CA, data DQ, the data strobe signal DQS, and the clock CLK/CLKb from the memory controller 20. The input and output circuit 18 transmits the command/address signal CA and the clock CLK/CLKb received from the memory controller 20 to the command/address circuit 16. The input and output circuit 18 transmits data DQ received from the memory controller 20 to the data circuit 15. The input and output circuit 18 transmits various control signals to the controller 17.

The command/address circuit 16 receives the command/address signal CA from the input and output circuit 18 and transmits a signal based on the command/address signal CA to the bank BK. The command/address circuit 16 receives the clock CLK/CLKb from the input and output circuit 18 and outputs various signals at the timing based on the clock CLK/CLKb. The command/address circuit 16 supplies a power supply voltage from an external power supply to the bank BK.

The data circuit 15 receives data DQ from the input and output circuit 18 and transmits data DQ to the bank BK.

The global write circuit 19 controls writing into the banks BK under the control of the controller 17. In a case where the power supply voltage is lowered, the global write circuit 19 performs writing of data into the memory cells MC of each bank BK based on the lowered power supply voltage.

The controller 17 controls each element based on a control signal through the input and output circuit 18.

Figure 4:
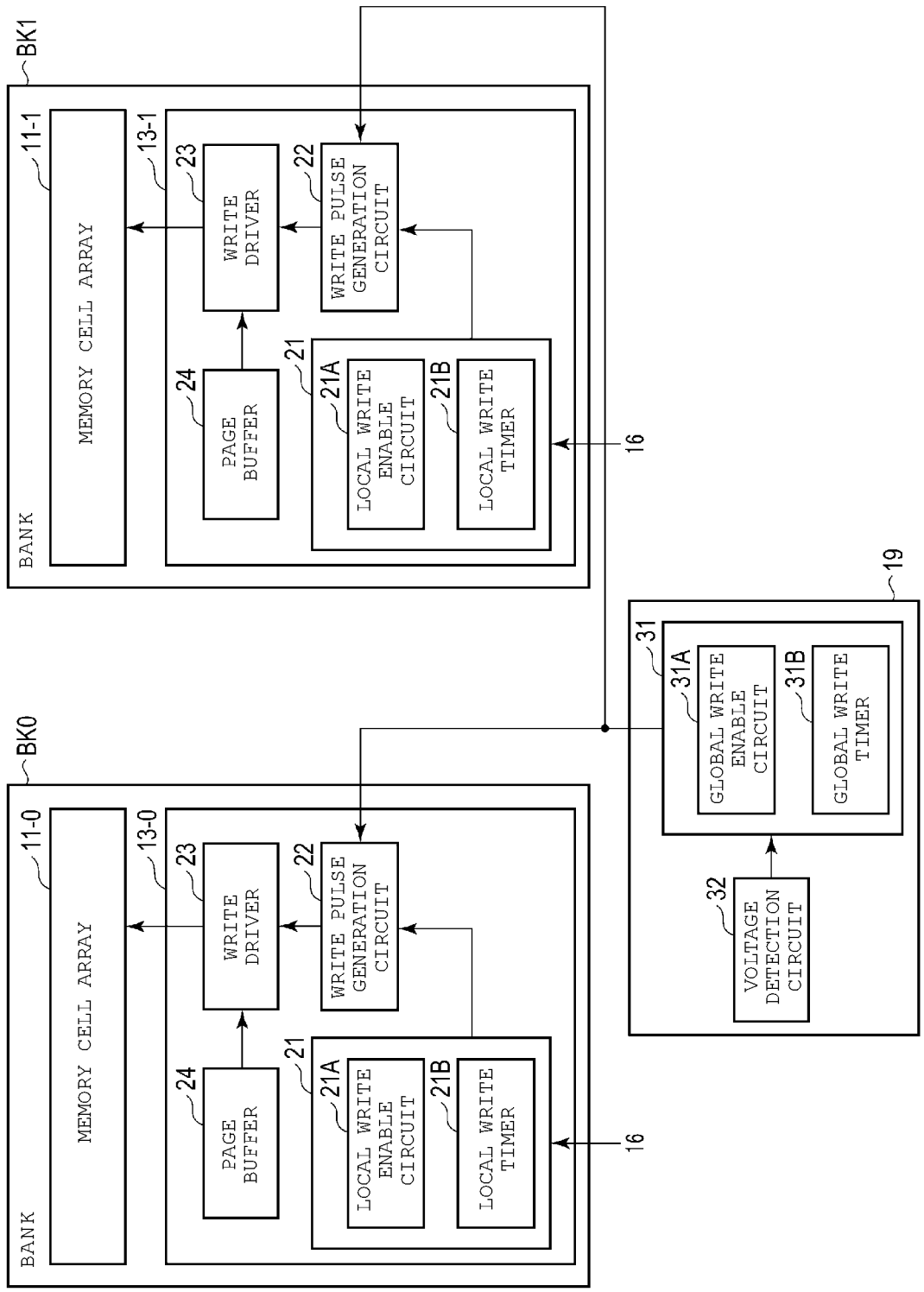
FIG. 4 depicts a global write circuit and a read/write circuit according to the first embodiment.

FIG. 4 is a diagram illustrating the global write circuit 19 and read/write circuits 13_0 and 13_1 according to the first embodiment. Here, for description, the banks BK0 and BK1 are illustrated and the banks BK2 and BK3 are omitted.

As illustrated in FIG. 4, the global write circuit 19 includes a global write controller 31 and a voltage detection circuit 32.

The voltage detection circuit 32 is electrically connected to a power supply voltage line and detects a lowering (or a powering down) of a power supply voltage VDD. This lowering of the power supply voltage VDD may be referred to as "power down" or a "powering down state." For example, in a case where the power supply voltage VDD is lowered from a first voltage V1 (for example, 1.2 V) at normal operating time to a second voltage V2 (for example, 0.9 V), the voltage detection circuit 32 detects the lowering of power supply voltage. Then, the voltage detection circuit 32 transmits a detection signal to the global write controller 31. In the following, the first voltage V1 and the second voltage V2 are described as voltage values or voltage levels.

The global write controller 31 controls writing for the banks BK based on the detection signal from the voltage detection circuit 32. In a case where the power supply voltage VDD is lowered, the global write controller 31 performs writing into the memory cells MC based on the lowered power supply voltage VDD. The global write controller 31 includes a global write enable circuit 31A and a global write timer 31B. The global write enable circuit 31A transmits a write enable signal to the write pulse generation circuit 22 based on the detection signal from the voltage detection circuit 32 and instructs the write pulse generation circuit 22 to perform writing. The global write timer 31B generates a write time t2 if the power supply voltage VDD is lowered, and transmits the write time t2 to the write pulse generation circuit 22. The write time t2 is a time during which data can still be sufficiently written to the memory cell MC in a case where the lowered power supply voltage VDD (second voltage V2) is used as a write voltage.

The read/write circuits 13_0 and 13_1 of the banks BK0 and BK1 respectively include a local write controller 21, a write pulse generation circuit 22, a write driver 23, and a page buffer 24.

The local write controller 21 controls writing based on a signal from the command/address circuit 16. The local write controller 21 performs writing into the memory cell MC based on the power supply voltage VDD in a case where the power supply voltage VDD is normal (that is, not lowered). The local write controller 21 includes a local write enable circuit 21A and a local write timer 21B. The local write enable circuit 21A transmits a write enable signal to the write pulse generation circuit 22 based on the signal from the command/address circuit 16, and instructs the write pulse generation circuit 22 to perform writing. The local write timer 21B generates the write time t1 in the case where the power supply voltage VDD is normal and transmits the write time t1 to the write pulse generation circuit 22. The write time t1 is a time within which data can be sufficiently written into the memory cell MC in a case where the power supply voltage VDD (at first voltage V1) is used as a write voltage.

In the MRAM, even in a case where a write voltage and a write current based on the write voltage is relatively small, it is possible to write data into the memory cell MC by lengthening the write time. Accordingly, the write time t2 in a case where the write voltage is the second voltage V2 (which is lower than first voltage V1) is longer than the write time t1 in a case where the write voltage is the first voltage V1.

The write pulse generation circuit 22 generates a write pulse under the control of the local write controller 21 in a case where the power supply voltage VDD is normal. That is, the write pulse generation circuit 22 generates a write pulse in accordance with the write time t1 of the local write timer 21B, according to an instruction from the local write enable circuit 21A.

In a case where the power supply voltage VDD is lowered, the write pulse generation circuit 22 generates a write pulse under the control of the global write controller 31. That is, the write pulse generation circuit 22 generates a write pulse in accordance with the write time t2 of the global write timer 31B, according to an instruction from the global write enable circuit 31A.

The page buffer 24 temporarily holds write data and read data.

The write driver 23 writes the data held in the page buffer 24 into the memory cells MC based on the write pulse generated by the write pulse generation circuit 22.

Figure 5:
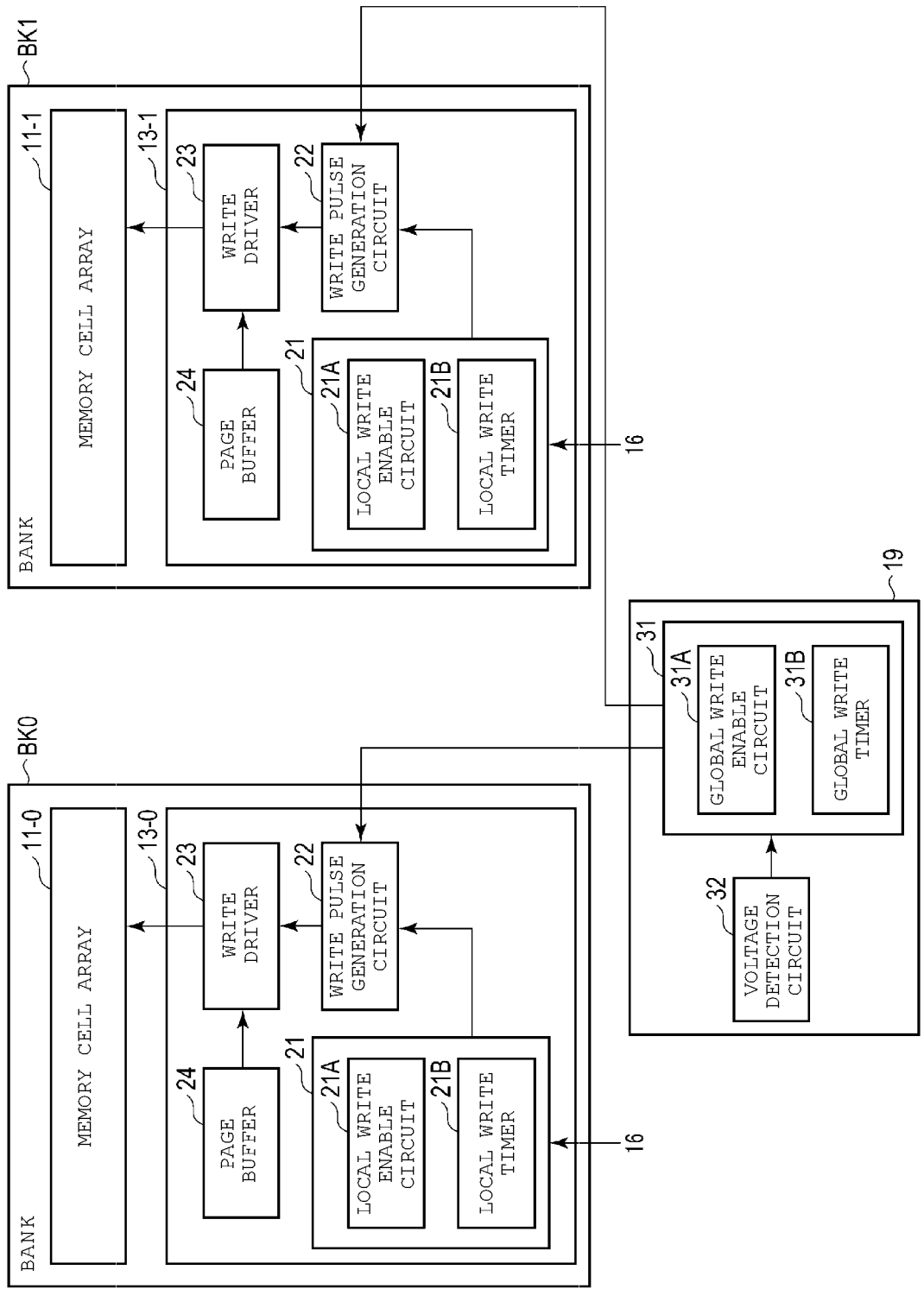
FIG. 5 depicts a modification example of the global write circuit and the read/write circuit according to the first embodiment.

FIG. 5 is a diagram illustrating a modification example of the global write circuit 19 and the read/write circuits 13_0 and 13_1 according to the first embodiment.

In a case where the global write controller 31 simultaneously transmits signals to all the banks BK, write is performed simultaneously to all the banks BK. In this case, write currents flow simultaneously to the memory cells MC of all the banks BK. As a result, a peak current increases and a large amount of current is consumed by a chip.

In contrast, as illustrated in FIG. 5, in the modification example, the global write controller 31 transmits a signal through a separate control line to each bank BK. The global write controller 31 transmits a signal to each bank BK by changing timing and performs writing into the memory cell MC. With this, the peak current can be reduced and current consumption can be reduced.

In a case where write into the memory cell MC is performed by a signal from the global write controller 31, a circuit not involved in writing may be stopped before write or during write. For example, the local write controller 21 may be stopped. With this, excessive current consumption can be prevented and the lowering of the write voltage can be prevented. As a result, a write error can be prevented.

The voltage detection circuit 32 may transmit a signal indicating end of write into the command/address circuit 16. Then, the command/address circuit 16 transmits a signal to each bank BK that is in an active state so that write is normally ended. With this, even at the time of power-down, the chip can be normally ended.

Operation Example of First Embodiment

Figure 6:
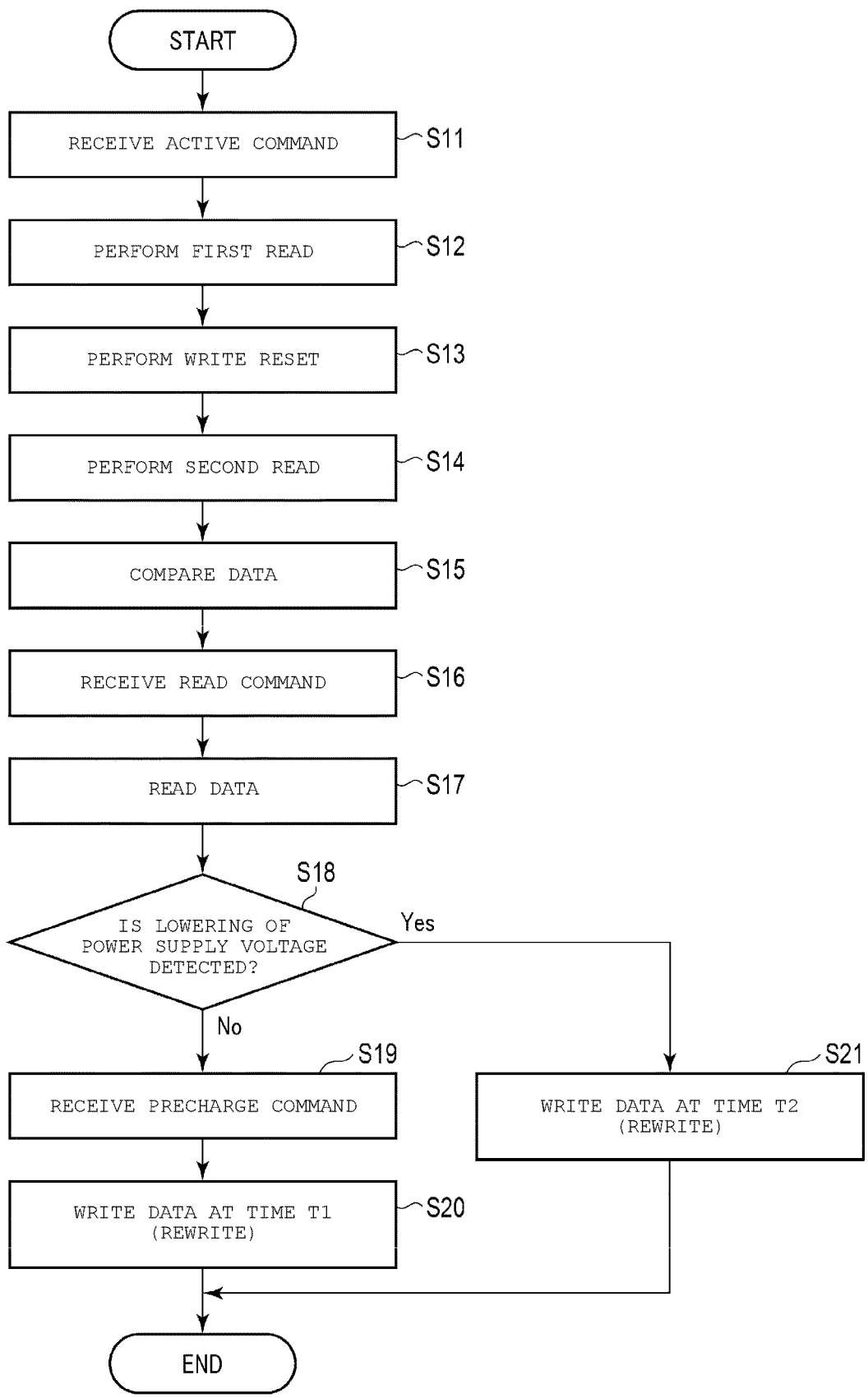
FIG. 6 is a flowchart illustrating aspects of a data reading operation in the semiconductor memory device according to the first embodiment.

FIG. 6 is a flowchart illustrating a read operation in the semiconductor memory device according to the first embodiment.

In the read operation example, a first read, a write reset, a second read, and a data comparison between the first read and the second read with respect to the memory cell MC are performed in this order. That is, a so-called self-reference read is performed. In a data rewrite after self-reference read, the write time is set to be longer according to the lowered power supply voltage VDD if the lowering of the power supply voltage VDD is detected. Reading in this example will be described in detail below. In the following, reading from the memory cell MC of the bank BK0 will be described.

As illustrated in FIG. 6, first, in step S11, the command/address circuit 16 receives an active command. In this case, the command/address circuit 16 also receives an address signal. With this, the command/address circuit 16 selects the memory cell MC of the bank BK0.

Next, in step S12, a sense amplifier of the read/write circuit 13_0 performs first read with respect to the selected memory cell MC (hereinafter, referred to as target memory cell MC). In the first read, data stored in the target memory cell MC is read. The read data (hereinafter, referred to as first data) is held in a sense amplifier latch.

Next, in step S13, the write driver 23 of the read/write circuit 13_0 performs writing reset with respect to the target memory cell MC. In the write reset, specific data (for example, data of "0") which is preset in the target memory cell MC is written.

Next, in step S14, the sense amplifier of the read/write circuit 13_0 performs the second read with respect to the target memory cell MC. In the second read, the specific data (hereinafter, referred to as second data) written in the target memory cell MC by the write reset is read. The read data is held in the sense amplifier latch.

Next, in step S15, the sense amplifier of the read/write circuit 13_0 compares the first data with the second data. More specifically, a current or a voltage corresponding to the first data is compared with a current or a voltage corresponding to the second data. According to the comparison result, the sense amplifier determines whether the first data is data of "0" or "1". The determination result (data of "0" or "1") is held in the page buffer 24.

Next, in step S16, the command/address circuit 16 receives a read command.

Next, in step S17, the command/address circuit 16 reads data held in the page buffer 24 to the outside.

Next, if the voltage detection circuit 32 does not detect the lowering of the power supply voltage VDD, that is, if the power supply voltage VDD maintains a normal first voltage V1 in step S18, the command/address circuit 16 receives a precharge command in step S19.

When the precharge command is received, in step S20, the write driver 23 performs writing of data held in the page buffer 24 under the control of the local write controller 21. That is, the write driver 23 performs writing into the target memory cell MC at the first time t1 using the first voltage V1 as the write voltage.

On the other hand, if the lowering of the power supply voltage VDD is detected by the voltage detection circuit 32 in step S18, that is, if the power supply voltage VDD is lowered from the normal first voltage V1 to the second voltage V2, the write driver 23 performs rewrite of data held in the page buffer 24 under the control of the global write controller 31 in step S20. That is, the write driver 23 performs writing into the target memory cell MC at the second time t2 using the second voltage V2 as the write voltage.

In the following, the write voltage and the write time will be described.

Figure 7:
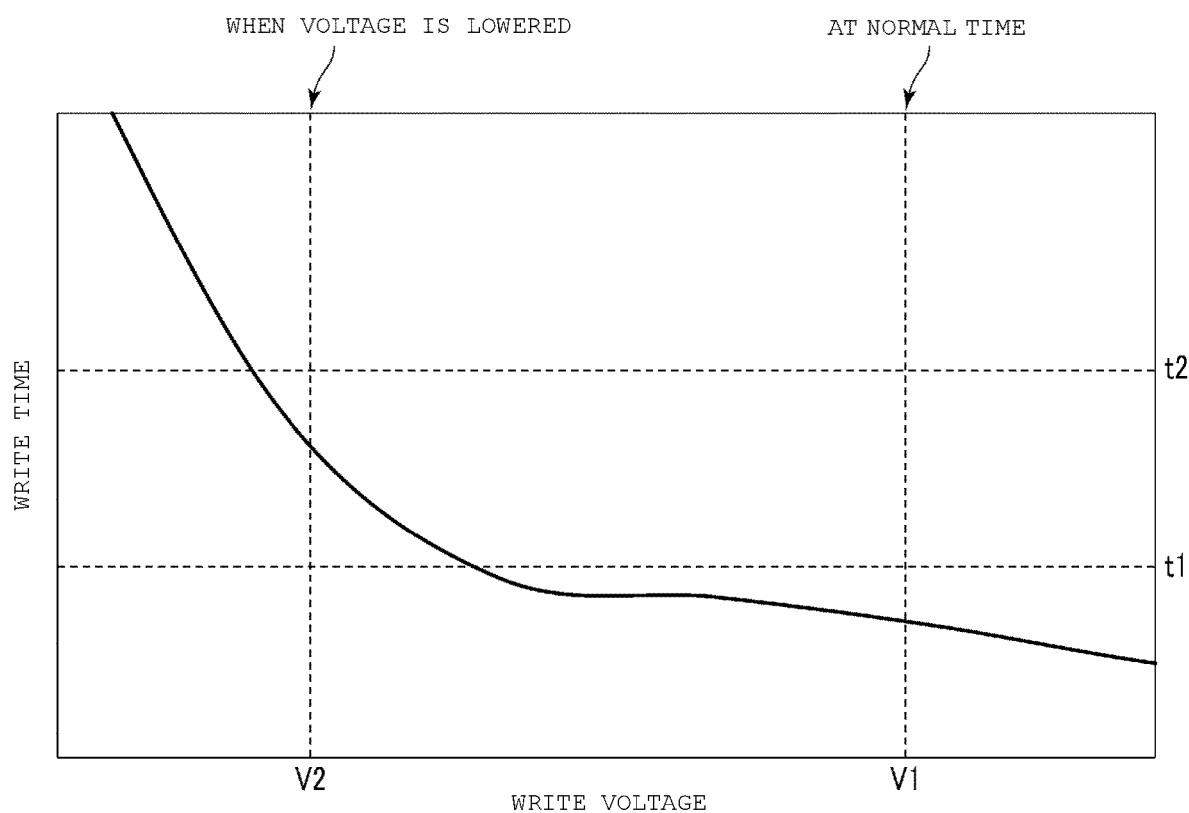
FIG. 7 is a diagram illustrating a relationship between a write voltage and a write time in the semiconductor memory device according to the first embodiment.

FIG. 7 is a diagram illustrating a relationship between the write voltage and the write time in the semiconductor memory device according to the first embodiment.

As illustrated in FIG. 7, in the MRAM, it is possible to perform writing into a memory cell in a short time as the write voltage becomes larger and in a long time as the write voltage becomes smaller. For example, if the write voltage is the first voltage V1 at the normal time, write is performed at the first time t1. The first time t1 is a time within which data can be sufficiently written into the memory cell MC in a case where the first voltage V1 is used as a write voltage. On the other hand, if the write voltage is the second voltage V2 (which is less than the first voltage V1), write is performed using the second time t2, which longer than the first time t1. The second time t2 is a time within which data can be sufficiently written into the memory cell MC in a case where written to the memory cells MC if the second voltage V2 is used as the write voltage. As described above, in the first embodiment, the write time is set according to the write voltage level.

Figure 8:
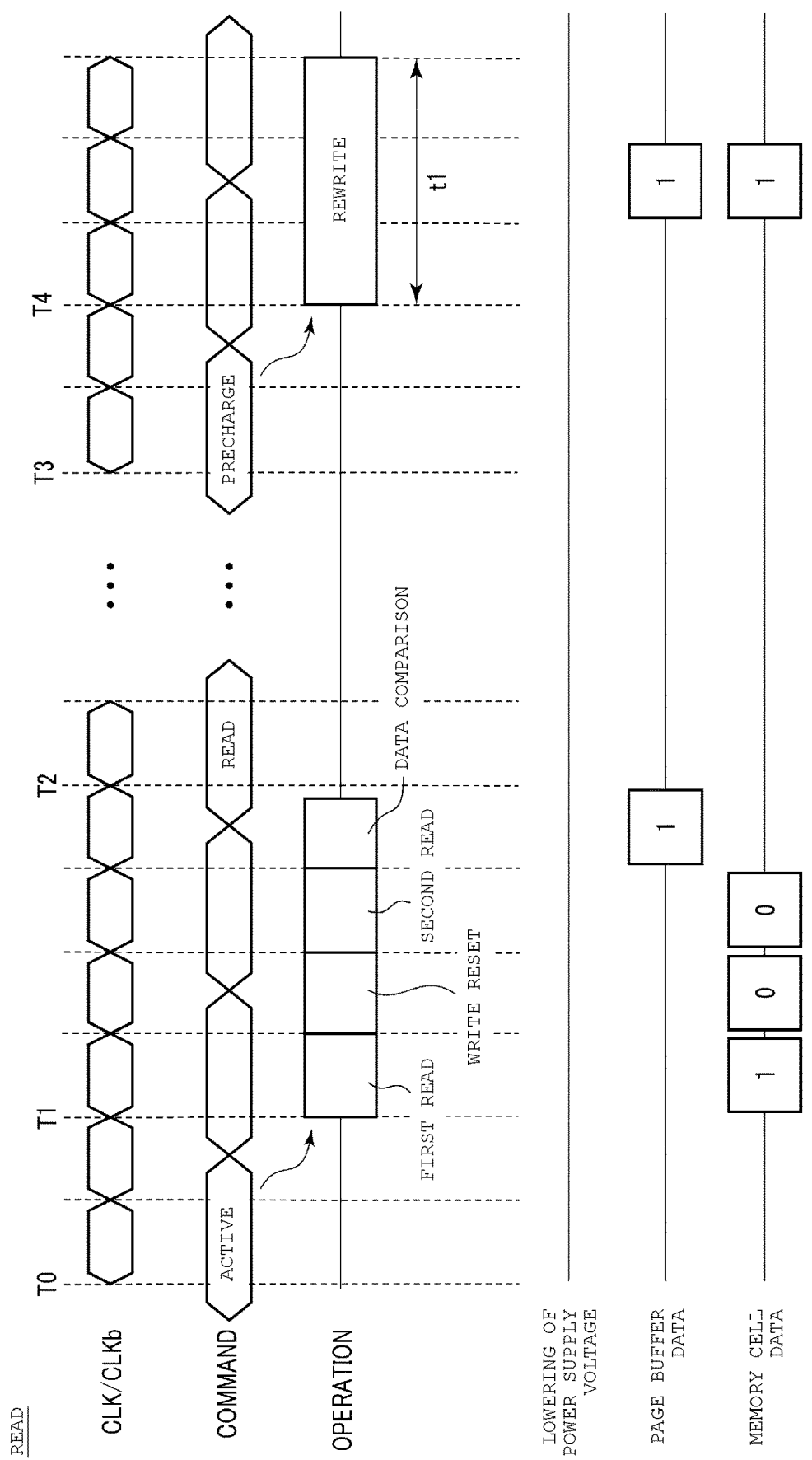
FIG. 8 is a timing chart illustrating aspects of a data reading process in the semiconductor memory device according to the first embodiment.
Figure 9:
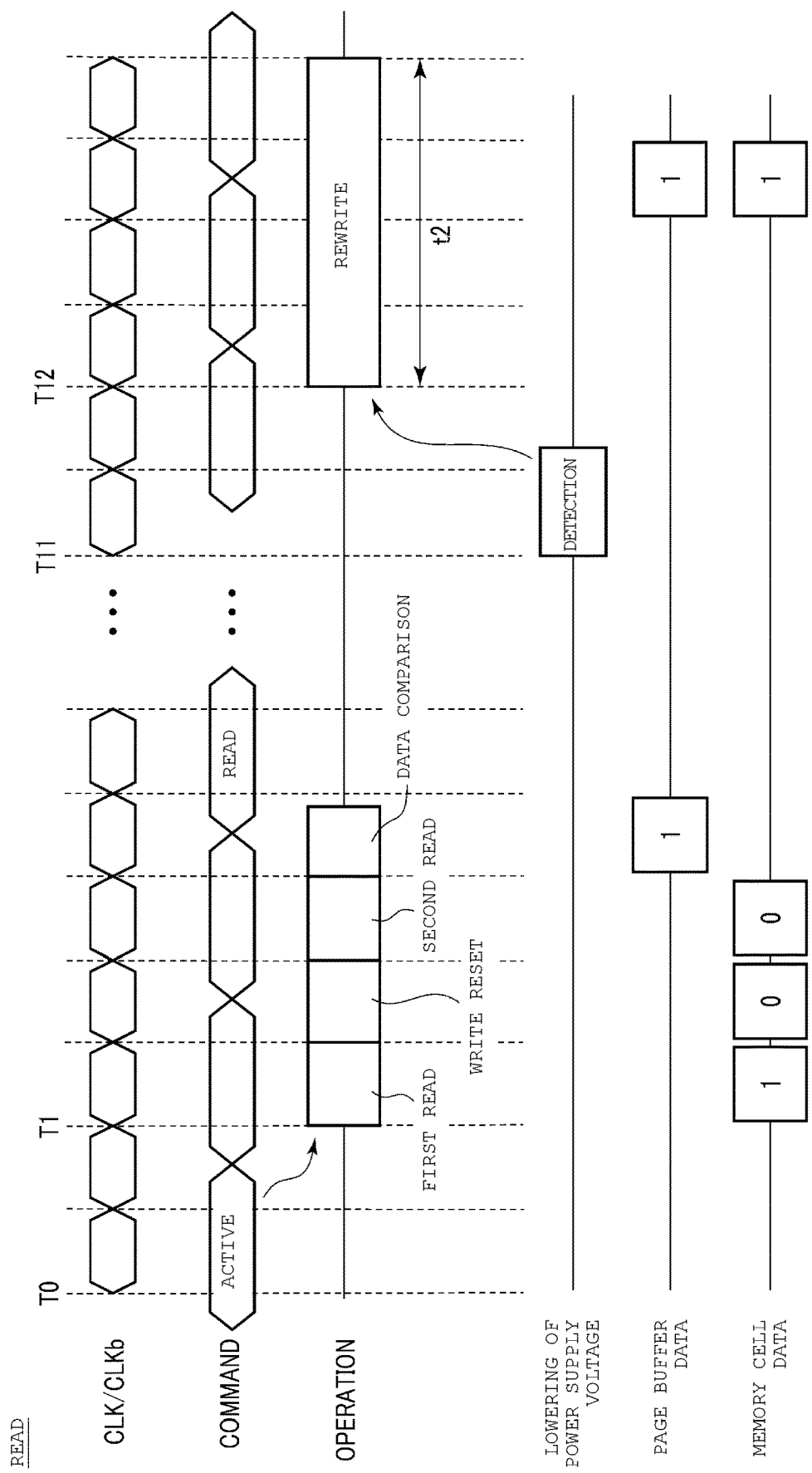
FIG. 9 is another timing chart illustrating aspects of a data reading process in the semiconductor memory device according to the first embodiment.

FIGS. 8 and 9 are timing charts illustrating read in the semiconductor memory device according to the first embodiment. FIG. 8 illustrates a case where the lowering of the power supply voltage is not detected (No in step S18 of FIG. 6, hereinafter, referred to as a first example) and FIG. 9 illustrates a case where the lowering of the power supply voltage is detected (in the case of Yes in step S18, hereinafter, referred to as a second example).

As illustrated in FIG. 8, the memory 10 operates by receiving various commands based on the timing of the clock CLK/CLKb.

First, in the first example, the command/address circuit 16 receives an active command at time T0.

When the active command is received, the sense amplifier of the read/write circuit 13_0 performs the first read with respect to the target memory cell MC at time T1. That is, data of "1" stored in the target memory cell MC is read. The read data of "1" is held in the sense amplifier latch.

Subsequently, the write driver 23 of the read/write circuit 13_0 performs the write reset with respect to the target memory cell MC. In the write reset, specific data of "0" which is preset in the target memory cell MC is written.

Furthermore, the sense amplifier of the read/write circuit 13_0 performs the second read with respect to the target memory cell MC. That is, the specific data of "0" written in the target memory cell MC by the write reset is read. The read data is held in the sense amplifier latch.

Then, the sense amplifier of the read/write circuit 13_0 compares the data of "1" read in the first read with the data of "0" read in the second read. The sense amplifier determines that data (data read in the first read) stored in the target memory cell MC is "1", based on the comparison result. The data of "1" is held in the page buffer 24.

Next, the command/address circuit 16 receives the read command at time T2. When the read command is received, the command/address circuit 16 reads the data held in the page buffer 24 to the outside.

Thereafter, the voltage detection circuit 32 does not detect the lowering of the power supply voltage VDD and the command/address circuit 16 receives the precharge command at time T3.

When the precharge command is received, the write driver 23 rewrites the data of "1" held in the page buffer 24 to the memory cell MC at time T4. In this case, the write driver 23 performs writing under the control of the local write controller 21. That is, the write driver 23 performs writing into the target memory cell MC at the first time t1 using the first voltage V1 as the write voltage.

On the other hand, as illustrated in FIG. 9, in the second example, the voltage detection circuit 32 detects the lowering of the power supply voltage VDD at time T11. When the lowering of the power supply voltage VDD is detected, the write driver 23 rewrites the data of "1" held in the page buffer 24 into the memory cell MC at time T12 even if the precharge command is not received. In this case, the write driver 23 performs writing under the control of the global write controller 31. That is, the write driver 23 performs writing into the target memory cell MC at the second time t2, which is longer than the first time t1, using the second voltage V2 as the write voltage.

Effects of First Embodiment

In the MRAM performing self-reference read, in reading, first read, write reset, second read, and data comparison of the first read and the second read for the memory cell MC are performed in this order. In this case, the write reset is performed so that original data of the memory cell MC is destroyed. Then, data finally read by the data comparison (data equivalent to original data) is held in the page buffer 24 and thereafter, is rewritten into the memory cell MC. In this case, unexpected lowering (power-down) of the power supply voltage VDD may occur after data is destroyed and before data is rewritten into the memory cell MC. In this case, the write voltage also is lowered and thus, it becomes difficult to accurately write the original data into the memory cell MC. As a result, there is a concern that the memory cell MC is in a state of storing erroneous data and correct data may be lost.

In contrast, in the first embodiment, the voltage detection circuit 32 and the global write controller 31 are provided. The voltage detection circuit 32 detects the lowering of the power supply voltage VDD and outputs a detection signal. According to a detection signal from the voltage detection circuit 32, the global write controller 31 performs writing into the memory cell MC based on the power supply voltage VDD (second voltage V2) lowered and detected. More specifically, the global write controller 31 performs writing into the memory cell MC at the write time t2, by using the second voltage V2 as the write voltage. The write time t2 is set to be longer than the write time t1 in the case of using the power supply voltage VDD (first voltage V1) at the normal time as the write voltage. With this, correct data can be written into the memory cell MC even by the lowered power supply voltage VDD, and loss of data due to the lowering of the power supply voltage VDD can be prevented.

In the first embodiment, although rewrite at the time of read in the MRAM in which data destructive type self-reference read is performed is described, but is not limited thereto. For example, loss of data accompanied by unexpected lowering of the power supply voltage VDD may occur during normal write in the MRAM in which data destructive type self-reference read is performed (when a write command is issued) or during normal write in the data non-destructive type MRAM. Also, in this case, write according to the first embodiment is applicable.

Second Embodiment

A semiconductor memory device according to a second embodiment will be described below with reference to FIGS. 10 and 11.

The second embodiment is a specific example of detection of the lowering of the power supply voltage VDD by the voltage detection circuit 32. In the second embodiment, when the power supply voltage VDD is lowered, the detection by the voltage detection circuit 32 is made earlier and the voltage detection circuit 32 sets the detection signal DET to the "H" level before the power supply circuit 41 powers off each bank BK. Hereinafter, the second embodiment will be described in detail.

In the second embodiment, aspects different from the first embodiment will be mainly described, and repeated or substantially similar aspects may be omitted from further description.

Configuration Example of Second Embodiment

Figure 10:
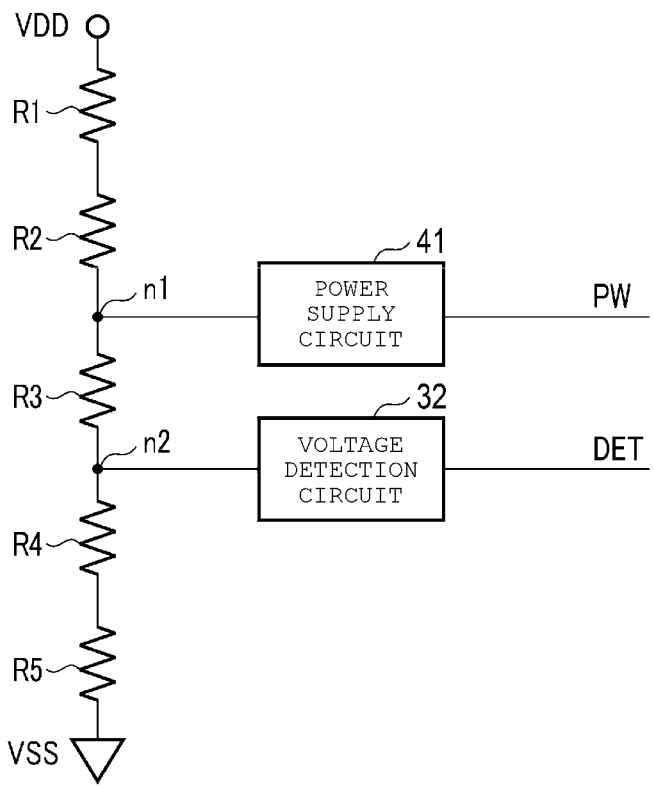
FIG. 10 depicts aspects of a voltage detection circuit and a power supply circuit in a semiconductor memory device according to a second embodiment.

FIG. 10 is a diagram illustrating the voltage detection circuit 32 and the power supply circuit 41 in the semiconductor memory device according to the second embodiment.

As illustrated in FIG. 10, resistors R1 to R5 are electrically connected in series between a power supply voltage line to which the power supply voltage VDD is supplied and a ground voltage line to which the ground voltage VSS is supplied. That is, a first terminal of the resistor R1 is electrically connected to the power supply voltage line and a second terminal of the resistor R1 is electrically connected to a first terminal of the resistor R2. A second terminal of resistor R2 is electrically connected to a first terminal of resistor R3 and a second terminal of resistor R3 is electrically connected to a first terminal of resistor R4 and a second terminal of resistor R4 is electrically connected to a first terminal of resistor R5. The second terminal of the resistor R5 is electrically connected to the ground voltage line.

The power supply circuit 41 is provided in the command/address circuit 16, for example. The power supply circuit 41 detects the power supply voltage VDD to thereby supply a signal PW, which functions as power to each bank BK. More specifically, the power supply circuit 41 is electrically connected to a connection terminal (node n1) between the second terminal of the resistor R2 and the first terminal of the resistor R3 and detects a signal based on the voltage of the node n1. A detection level of the power supply circuit 41 is a voltage VTH. For that reason, when a voltage of the node n1 is greater than the voltage VTH, the power supply circuit 41 outputs the signal PW as a "H" or "High" level signal and thus powers on each bank BK. On the other hand, when the voltage of the node n1 is less than or equal to the voltage VTH, the power supply circuit 41 outputs the signal PW as a "L" or "Low" level signal and thus, powers off each bank BK.

The voltage detection circuit 32 detects the lowering of the power supply voltage VDD so as to supply the detection signal DET to the global write controller 31. More specifically, the voltage detection circuit 32 is electrically connected to a connection terminal (node n2) between the second terminal of the resistor R3 and the first terminal of the resistor R4 and detects a signal based on a voltage of the node n2. A detection level of the voltage detection circuit 32 is the same voltage VTH as the detection level of the power supply circuit 41. For that reason, if the voltage of the node n2 is lower than or equal to the voltage VTH, the voltage detection circuit 32 outputs the detection signal DET as the "H" level signal. On the other hand, if the voltage of the node n2 is higher than the voltage VTH, the voltage detection circuit 32 outputs the detection signal DET as the "L" level signal.

Operation Example of Second Embodiment

Figure 11:
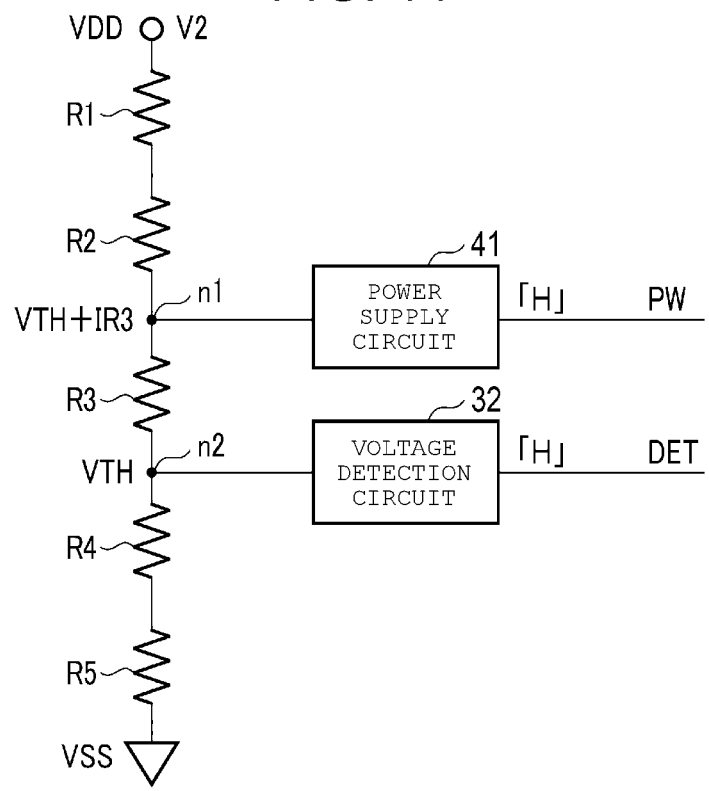
FIG. 11 depicts operational aspects of a voltage detection circuit and a power supply circuit in a semiconductor memory device according to the second embodiment.

FIG. 11 is a diagram illustrating operations of the voltage detection circuit 32 and the power supply circuit 41 in the semiconductor memory device according to the second embodiment. Here, a detection operation of the lowering of the power supply voltage VDD by the voltage detection circuit 32 is illustrated.

In the operation example, when the power supply voltage VDD is lowered, the voltage detection circuit 32 sets the detection signal DET to the "H" level before the power supply circuit 41 powers off the bank BK. That is, in a state where each bank BK is powered on, write by the global write controller 31 is executed. In the following, the detection operation of the lowering of the power supply voltage VDD will be described in detail.

As illustrated in FIG. 11, when the power supply voltage VDD is lowered to the second voltage V2, the voltage VTH is applied to the node n2. When the voltage VTH of the node n2 is detected, the voltage detection circuit 32 determines that the power supply voltage VDD has been lowered. Then, the voltage detection circuit 32 outputs the detection signal DET at the "H" level to the global write controller 31. According to the detection signal DET, the global write controller 31 performs writing of data into the memory cell MC based on the power supply voltage VDD having been lowered and detected as such.

On the other hand, a voltage "VTH+I×R3" is applied to the node n1. Here, the value "I" represents the current flowing through the resistor R3 and the value "R3" represents a resistance value of the resistor R3. That is, a voltage higher than that of the node n2 is applied to the node n1. As described above, the detection level of the power supply circuit 41 is the same as the detection level of the voltage detection circuit 32. For that reason, the power supply circuit 41 outputs the signal PW of "H" level to power on each bank BK.

Effect of Second Embodiment

In a case where the detection level of the power supply circuit 41 is the same as the detection level of the voltage detection circuit 32 and a detection node of the power supply circuit 41 is the same as a detection node of the voltage detection circuit 32, there is a possibility that detection by the power supply circuit 41 and detection by the voltage detection circuit 32 will be made at the same timing when the power supply voltage VDD is lowered. In this case, even when the voltage detection circuit 32 sets the detection signal DET to the "H" level, the power supply circuit 41 powers off each bank BK. As a result, it is unable to implement write by the global write controller 31 accompanied by the lowering of the power supply voltage VDD.

In contrast, in the second embodiment, the detection level of the power supply circuit 41 is the same as the detection level of the voltage detection circuit 32 and the detection node of the power supply circuit 41 and the detection node of the voltage detection circuit 32 are different. More specifically, the voltage of the detection node (node n2) of the voltage detection circuit 32 is set to be smaller than the voltage of the detection node (node n1) of the power supply circuit 41. With this, when the power supply voltage VDD is lowered, the voltage detection circuit 32 can detect the lowering of the power supply voltage VDD first. That is, the voltage detection circuit 32 can detect the lowering of the power supply voltage VDD even when a lowered amount of the power supply voltage VDD is small. With this, the voltage detection circuit 32 sets the detection signal DET to the "H" level before the power supply circuit 41 powers off each bank BK (in a state where each bank BK is powered on). Accordingly, it is possible to implement write by the global write controller 31 accompanied by the lowering of the power supply voltage VDD.

Third Embodiment

A semiconductor memory device according to a third embodiment will be described below with reference to FIGS. 12 and 13.

The third embodiment is a modification example of the second embodiment and the detection level of the voltage detection circuit 32 changes according to the temperature. In the following, the third embodiment will be described in detail.

In the third embodiment, aspects different from the second embodiment will be mainly described, and substantially similar aspects or repeated aspects may be omitted.

Configuration Example of Third Embodiment

Figure 12:
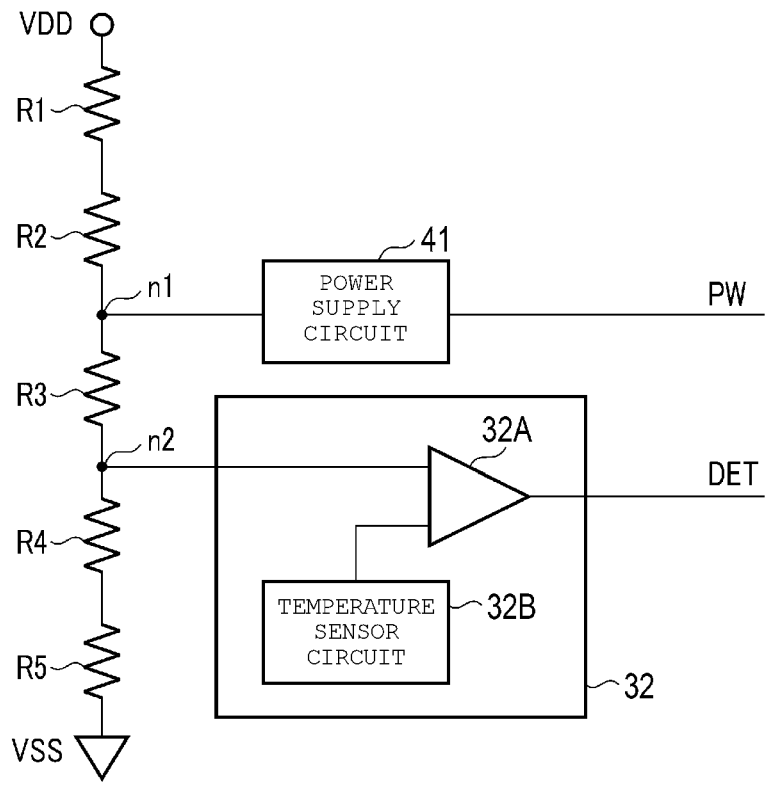
FIG. 12 depicts a voltage detection circuit and a power supply circuit in a semiconductor memory device according to a third embodiment.

FIG. 12 is a diagram illustrating the voltage detection circuit 32 and the power supply circuit 41 in a semiconductor memory device according to the third embodiment.

As illustrated in FIG. 12, the voltage detection circuit 32 includes a comparator 32A and a temperature sensor circuit 32B.

A first input terminal of the comparator 32A is electrically connected to the node n2 and a second input terminal of the comparator 32A is electrically connected to an output terminal of the temperature sensor circuit 32B. An output terminal of the comparator 32A outputs the detection signal DET.

The temperature sensor circuit 32B includes a band gap reference (BGR) circuit and the like. The temperature sensor circuit 32B generates and outputs different voltages according to a temperature. More specifically, the temperature sensor circuit 32B generates and outputs a low voltage at high temperature and generates and outputs a high voltage at low temperature.

Operation Example of Third Embodiment

Figure 13:
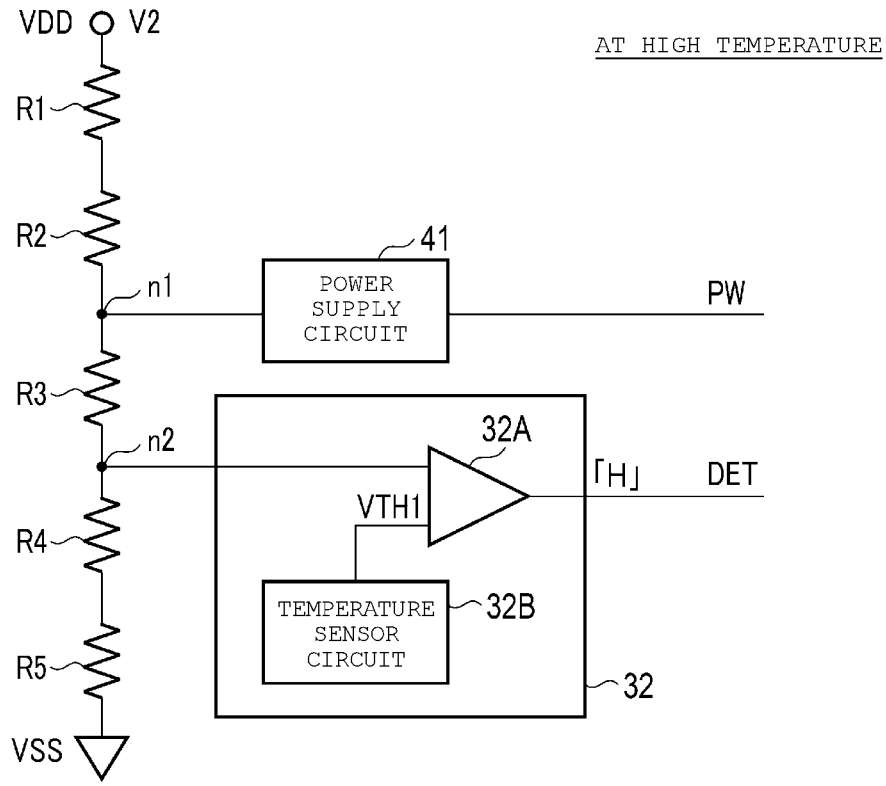
FIG. 13 depicts operational aspects of a voltage detection circuit in a semiconductor memory device according to the third embodiment.
Figure 14:
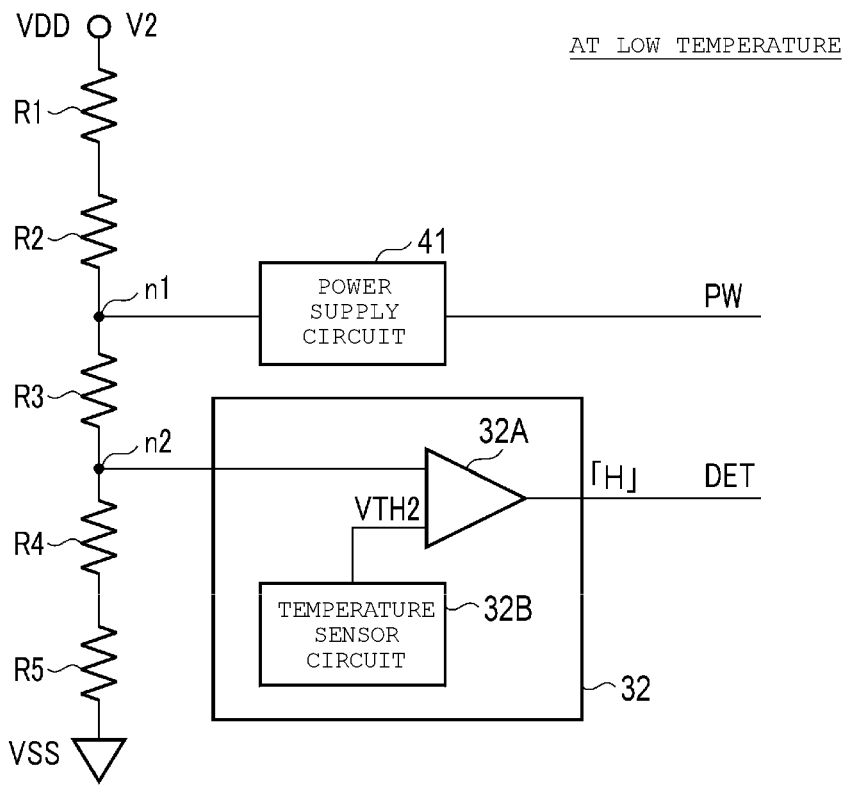
FIG. 14 depicts operational aspects of a voltage detection circuit in a semiconductor memory device according to the third embodiment.

FIGS. 13 and 14 are diagrams illustrating the operation of the voltage detection circuit 32 in the semiconductor memory device according to the third embodiment. More specifically, FIG. 13 illustrates the operation of the voltage detection circuit 32 at high temperature and FIG. 14 illustrates the operation of the voltage detection circuit 32 at low temperature. Here, the detection operation of the lowering of the power supply voltage VDD by the voltage detection circuit 32 is illustrated.

In the operation example, the detection level of the voltage detection circuit 32 changes according to the temperature. The detection operation of the lowering of the power supply voltage VDD will be described in detail below.

As illustrated in FIG. 13, at high temperature, the temperature sensor circuit 32B generates and outputs a low voltage (voltage VTH1). The comparator 32A compares a signal based on the voltage VTH1 with a signal based on the voltage of the node n2. Then, if the voltage of the node n2 becomes lower than or equal to the voltage VTH1, the comparator 32A outputs the detection signal DET of "H" level.

On the other hand, as illustrated in FIG. 14, at low temperature, the temperature sensor circuit 32B generates and outputs a high voltage (voltage VTH2>VTH1). The comparator 32A compares a signal based on a voltage VTH2 with a signal based on the voltage of the node n2. Then, if the voltage of the node n2 becomes lower than or equal to the voltage VTH2, the comparator 32A outputs the detection signal DET of "H" level.

Effect of Third Embodiment

In the MRAM, it is easy to write data into the memory cell MC at high temperature and it becomes difficult to write data into the memory cell MC at low temperature. For that reason, a higher write current and a higher write voltage are required as the temperature changes from high temperature to low temperature.

In contrast, in the third embodiment, the voltage detection circuit 32 includes the temperature sensor circuit 32B, and the detection level of the voltage detection circuit 32 at the time when the power supply voltage VDD is lowered changes according to the temperature. More specifically, the detection level is set to a low voltage (voltage VTH1) at high temperature and the detection level is set to a high voltage (voltage VTH2) at low temperature. With this, even if the optimum write voltage changes depending on the temperature, correct data can be written into the memory cell MC with good reliability by the lowered power supply voltage VDD.

Fourth Embodiment

A semiconductor memory device according to a fourth embodiment will be described below with reference to FIGS. 15 to 17.

The fourth embodiment is a modification example of the second embodiment and the voltage detection circuit 32 operates according to an active command (active flag signal ACTFLG). In the following, the fourth embodiment will be described in detail.

In the fourth embodiment, aspects different from the second embodiment will be mainly described, and substantially similar aspects or repeated aspects may be omitted.

Configuration Example of Fourth Embodiment

Figure 15:
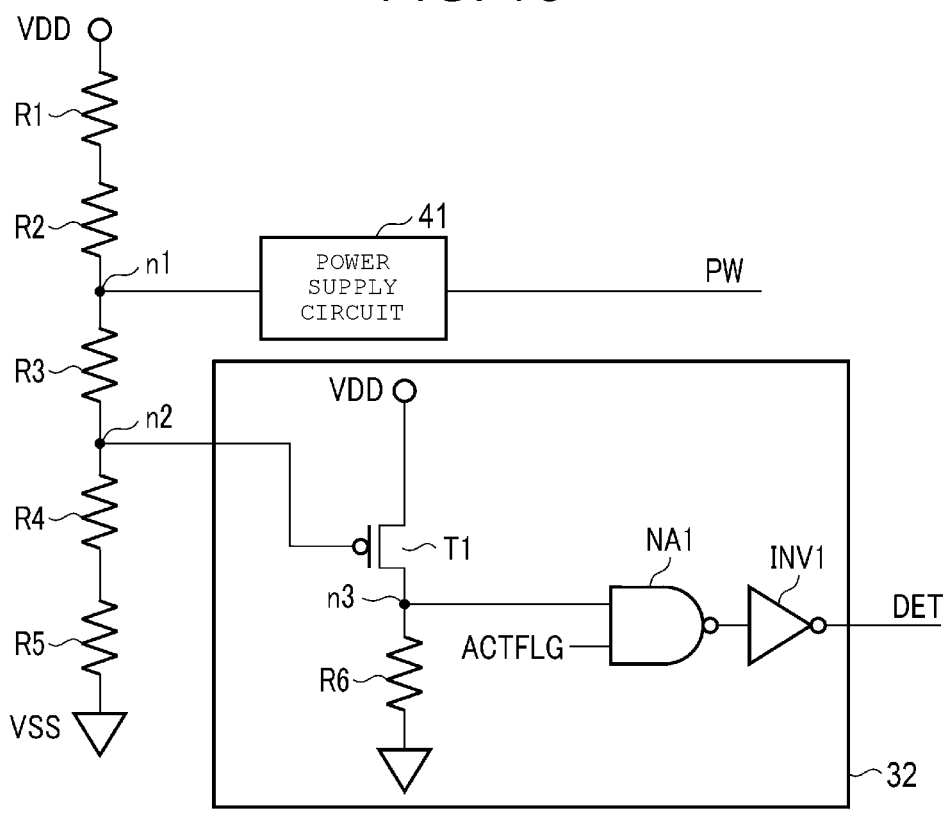
FIG. 15 depicts a voltage detection circuit and a power supply circuit in a semiconductor memory device according to a fourth embodiment.

FIG. 15 is a diagram illustrating the voltage detection circuit 32 and the power supply circuit 41 in the semiconductor memory device according to the fourth embodiment.

As illustrated in FIG. 15, the voltage detection circuit 32 includes a PMOS transistor T1, a resistor R6, a NAND circuit NA1, and an inverter INV1.

A first terminal of the PMOS transistor T1 is electrically connected to the power supply voltage line, a second terminal of the PMOS transistor T1 is electrically connected to a first terminal of a resistor R6, and a control terminal of the PMOS transistor T1 is electrically connected to the node n2. A second terminal of the resistor R6 is electrically connected to the ground voltage line.

A first input terminal of the NAND circuit NA1 is electrically connected to a connection terminal (node n3) between the second terminal of the PMOS transistor T1 and the first terminal of the resistor R6. The active flag signal ACTFLG is input to a second input terminal of the NAND circuit NA1. An output terminal of the NAND circuit NA1 is electrically connected to an input terminal of the inverter INV1. An output terminal of the inverter INV1 outputs the detection signal DET.

Operation Example of Fourth Embodiment

Figure 16:
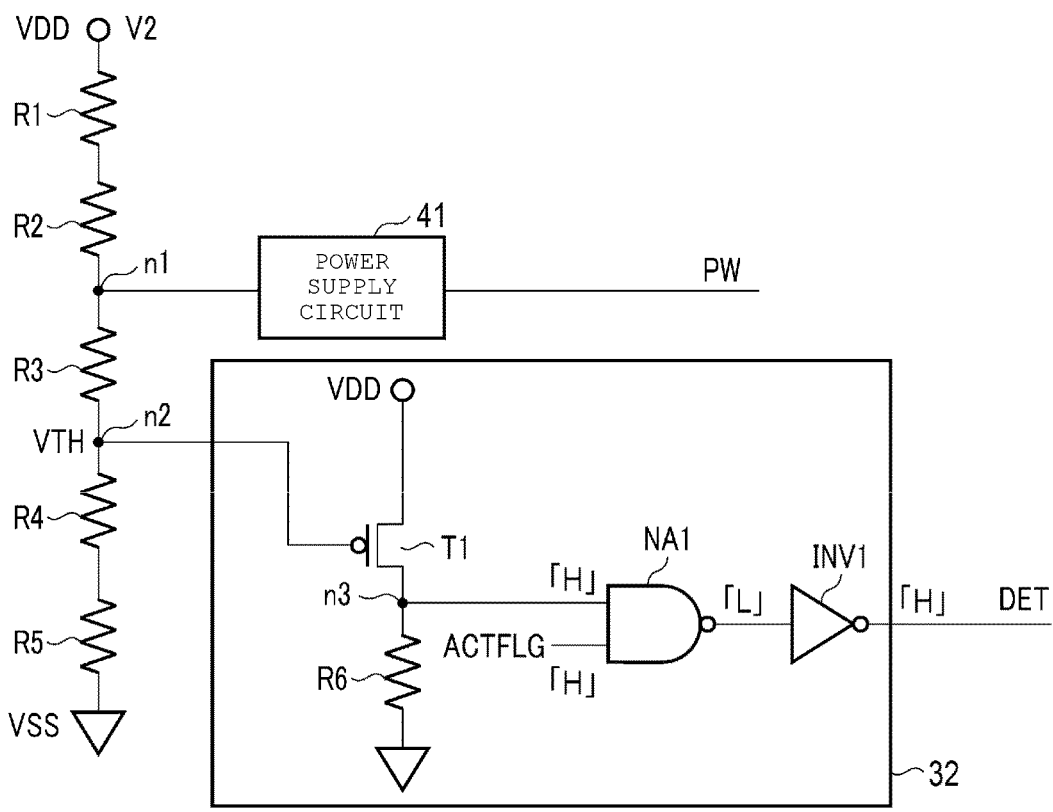
FIG. 16 depicts operational aspects of a voltage detection circuit in a semiconductor memory device according to the fourth embodiment.
Figure 17:
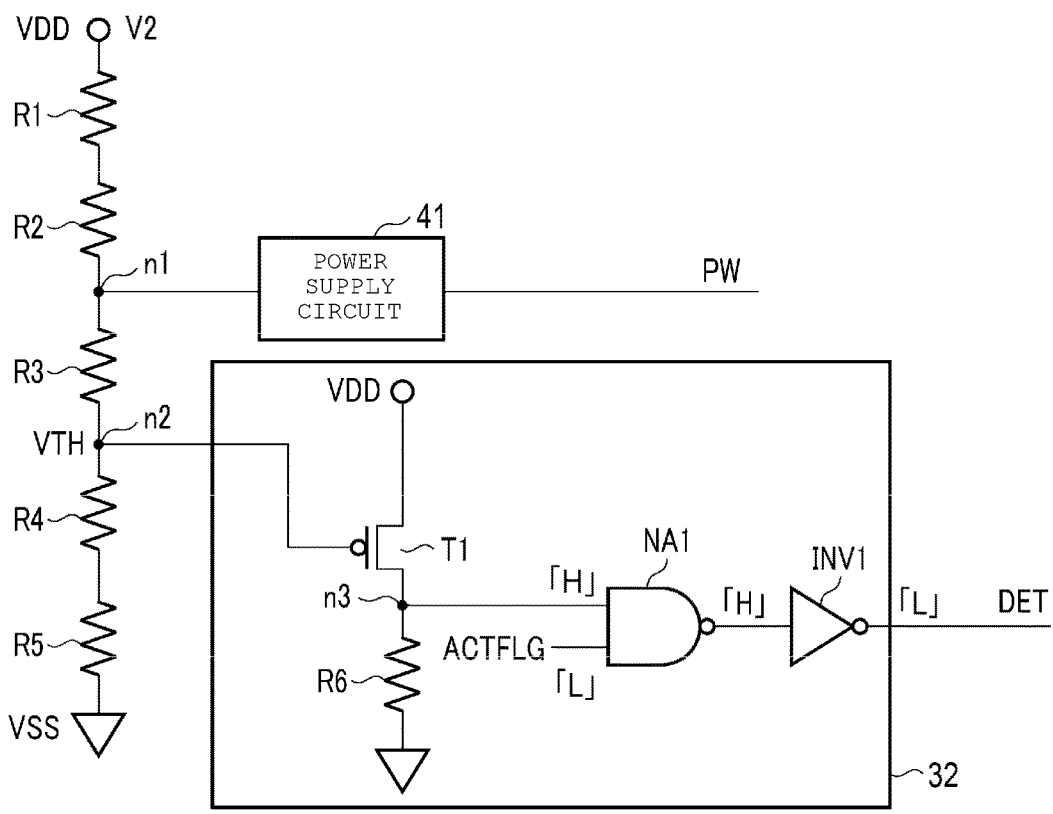
FIG. 17 depicts operational aspects of a voltage detection circuit in a semiconductor memory device according to the fourth embodiment.

FIGS. 16 and 17 are diagrams illustrating the operation of the voltage detection circuit 32 in the semiconductor memory device according to the fourth embodiment. More specifically, FIG. 16 illustrates the operation if the active command is received and FIG. 17 illustrates the operation if the active command is not received. Here, a detection operation of the lowering of the power supply voltage VDD by the voltage detection circuit 32 is illustrated.

In the operation example, if the lowering of the power supply voltage VDD is detected when the active command is received, the detection signal DET becomes the "H" level. On the other hand, if the lowering of the power supply voltage VDD is detected when the active command is not received, the detection signal DET becomes the "L" level. In the following, the detection operation of the lowering of the power supply voltage VDD will be described.

As illustrated in FIG. 16, when the active command is received, the bank BK becomes active and the active flag signal ACTFLG becomes the "H" level. The "H" level of the active flag signal ACTFLG is maintained until the precharge command is received. In this case, when the power supply voltage VDD is lowered to the second voltage V2, the voltage VTH is applied to the node n2. That is, the voltage VTH is applied to the control terminal of the transistor T1. The voltage VTH is a threshold voltage of the transistor T1. With this, the transistor T1 is turned ON, and a signal of "H" level is input to the first input terminal of the NAND circuit NA1. Accordingly, the NAND circuit NA1 outputs the signal of "L" level and the inverter INV1 outputs the detection signal DET of "H" level. According to the detection signal DET of "H" level, the global write controller 31 performs writing into the memory cell MC based on the power supply voltage VDD (second voltage V2) which is detected and lowered.

On the other hand, as illustrated in FIG. 17, when the active command is not received, the bank BK is in a state (for example, a standby state) other than an active state and the active flag signal ACTFLG becomes the "L" level. In this case, when the power supply voltage VDD is lowered to the second voltage V2, the voltage VTH is applied to the node n2. With this, similarly to FIG. 16, a signal of "H" level is input to the first input terminal of the NAND circuit NA1. Then, the NAND circuit NA1 outputs the signal of "H" level and the inverter INV1 outputs the detection signal DET of "L" level. Accordingly, when the bank BK is in a state other than the active state, the global write controller 31 does not operate even if power down occurs.

Effects of Fourth Embodiment

According to the fourth embodiment, the voltage detection circuit 32 operates according to the active command. More specifically, if the lowering of the power supply voltage VDD is detected when the bank BK is in the active state, the detection signal DET becomes the "H" level and the global write controller 31 performs writing. On the other hand, if the lowering of the power supply voltage VDD is detected when the bank BK is in the state other than the active state, the detection signal DET becomes the "L" level and the global write controller 31 does not perform writing. With this, even if power-down occurs in the state other than the active state, it is possible to prevent the global write controller 31 from malfunctioning.

Fifth Embodiment

A semiconductor memory device according to a fifth embodiment will be described below with reference to FIGS. 18 to 20.

The fifth embodiment is a modification example of the second embodiment and the voltage detection circuit 32 operates according to a write command (write flag signal WTFLG) and a read command (read flag signal RDFLG). In the following, the fifth embodiment will be described in detail.

In the fifth embodiment, aspects different from the second embodiment will be mainly described, and substantially similar aspects or repeated aspects may be omitted.

Example of Configuration of Fifth Embodiment

Figure 18:
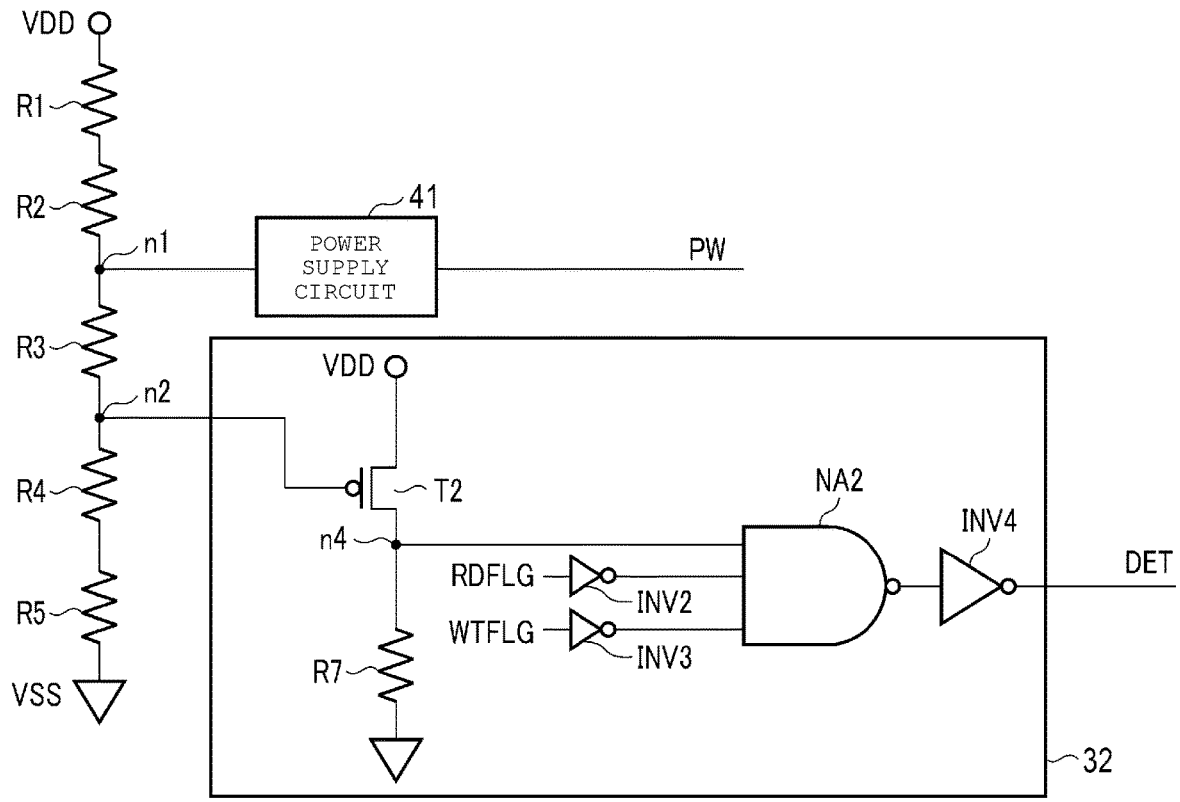
FIG. 18 depicts a voltage detection circuit and a power supply circuit in a semiconductor memory device according to a fifth embodiment.

FIG. 18 is a diagram illustrating the voltage detection circuit 32 and the power supply circuit 41 in the semiconductor memory device according to the fifth embodiment.

As illustrated in FIG. 18, the voltage detection circuit 32 includes a PMOS transistor T2, a resistor R7, a NAND circuit NA2, and inverters INV2 to INV4.

A first terminal of the PMOS transistor T2 is electrically connected to the power supply voltage line, a second terminal of the PMOS transistor T2 is electrically connected to a first terminal of the resistor R7, and a control terminal of the PMOS transistor T2 is electrically connected to the node n2. A second terminal of the resistor R7 is electrically connected to the ground voltage line.

A first input terminal of the NAND circuit NA2 is electrically connected to a connection terminal (node n4) between the second terminal of the PMOS transistor T2 and the first terminal of the resistor R7. The read flag signal RDFLG is input to an input terminal of the inverter INV2 and an output terminal of the inverter INV2 is electrically connected to a second input terminal of the NAND circuit NA2. The write flag signal WTFLG is input to an input terminal of the inverter INV3 and an output terminal of the inverter INV3 is electrically connected to a third input terminal of the NAND circuit NA2. An output terminal of the NAND circuit NA2 is electrically connected to an input terminal of the inverter INV4. An output terminal of the inverter INV4 outputs the detection signal DET.

Operation Example of Fifth Embodiment

Figure 19:
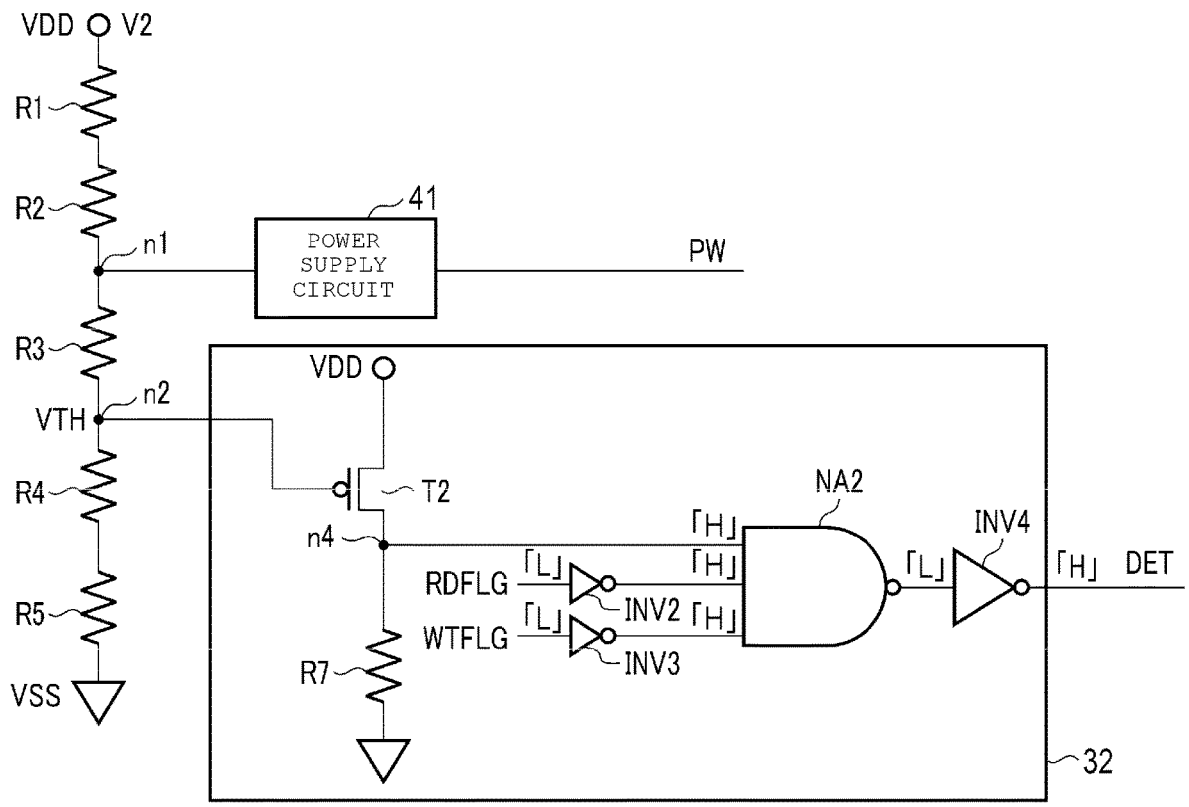
FIG. 19 depicts operational aspects of a voltage detection circuit in a semiconductor memory device according to the fifth embodiment.
Figure 20:
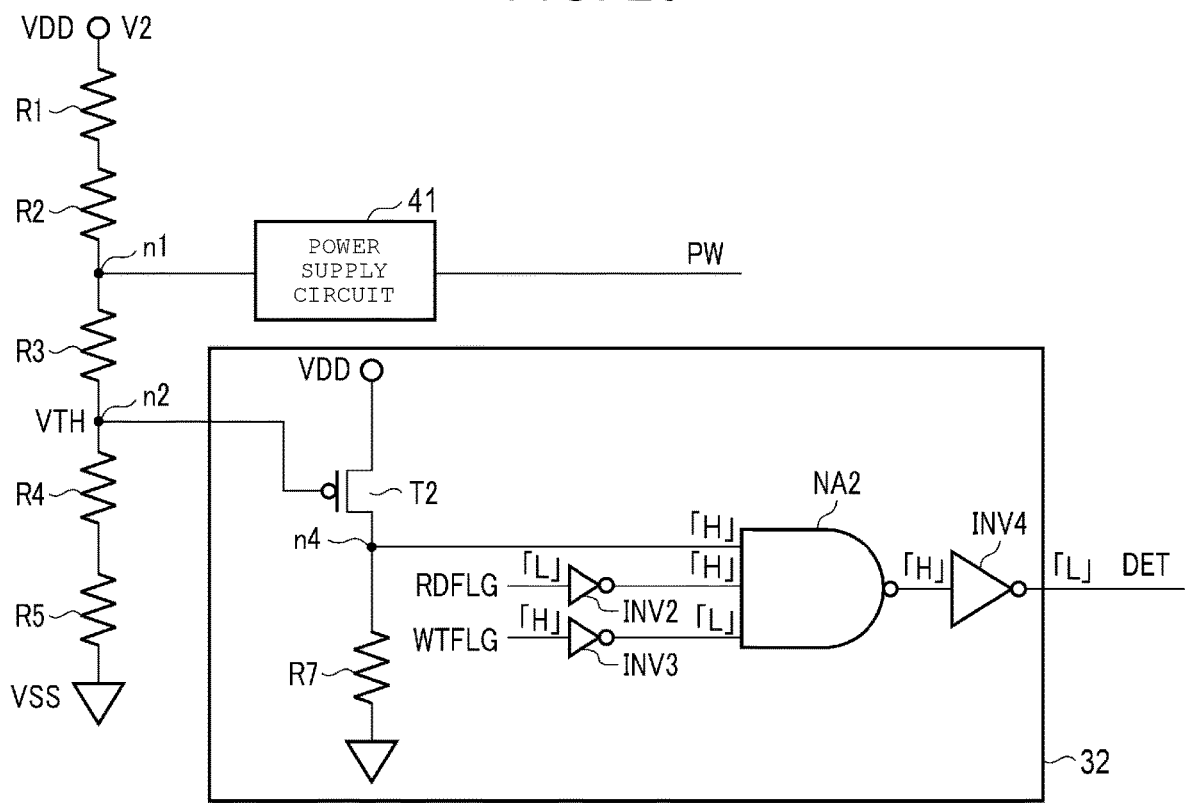
FIG. 20 depicts operational aspects of a voltage detection circuit in a semiconductor memory device according to the fifth embodiment.

FIGS. 19 and 20 are diagrams illustrating the operation of the voltage detection circuit 32 in the semiconductor memory device according to the fifth embodiment. More specifically, FIG. 19 illustrates the operation if the write command and the read command are not received and FIG. 20 illustrates the operation if the write command is received. Here, a detection operation of the lowering of the power supply voltage VDD by the voltage detection circuit 32 is illustrated.

In the operation example, when the lowering of the power supply voltage VDD is detected when the write command and the read command are not received, the detection signal DET becomes the "H" level. On the other hand, when the lowering of the power supply voltage VDD is detected when one of the write command and the read command is received, the detection signal DET becomes the "L" level. In the following, a detection operation of the lowering of the power supply voltage VDD will be described in detail below.

As illustrated in FIG. 19, when the write command and the read command are not received, the write flag signal WTFLG and the read flag signal RDFLG become the "L" level. For that reason, a signal of "H" level is input to the second input terminal and the third input terminal of the NAND circuit NA2. In this case, if the power supply voltage VDD is lowered to the second voltage V2, the voltage VTH is applied to the node n2. That is, the voltage VTH is applied to the control terminal of the transistor T2. The voltage VTH is a threshold voltage of transistor T2. With this, the transistor T2 is turned ON and the signal of "H" level is input to the first input terminal of the NAND circuit NA2. Accordingly, the NAND circuit NA2 outputs a signal of "L" level and the inverter INV4 outputs the detection signal DET of "H" level. According to the detection signal DET of "H" level, the global write controller 31 performs writing into the memory cell MC based on the power supply voltage VDD (second voltage V2) which is detected and lowered.

On the other hand, as illustrated in FIG. 20, when the write command is received, the write flag signal WTFLG becomes the "H" level. For that reason, the signal of "L" level is input to the third input terminal of the NAND circuit NA2. In this case, if the power supply voltage VDD is lowered to the second voltage V2, the voltage VTH is applied to the node n2. With this, similarly to FIG. 19, the signal of "H" level is input to the first input terminal of the NAND circuit NA2. Then, the NAND circuit NA2 outputs the signal of "H" level and the inverter INV1 outputs the detection signal DET of "L" level. Accordingly, when the write command is received, the global write controller 31 does not operate even if power down occurs.

Even when the read command is received, the voltage detection circuit 32 operates similarly as when the write command is received.

Effect of Fifth Embodiment

When the write command or the read command is received, each circuit operates based on the received command. For that reason, a current is generated in each circuit and a large amount of current consumption occurs at its peak. Due to this influence of the large amount of current consumption, the power supply voltage VDD is temporarily lowered immediately after receiving the write command or the read command. When the voltage detection circuit 32 detects temporary lowering of the power supply voltage VDD, the global light controller 31 malfunctions.

In contrast, according to the fifth embodiment, the voltage detection circuit 32 operates according to the write command and the read command. More specifically, when the lowering of the power supply voltage VDD is detected when the write command and the read command are not received, the detection signal DET becomes the "H" level and the global write controller 31 performs writing. On the other hand, if the lowering of the power supply voltage VDD is detected when one of the write command or the read command is received, the detection signal DET becomes the "L" level and the global write controller 31 does not perform writing. With this, when a power down occurs accompanied by reception of the write command or the read command, it is possible to prevent the global write controller 31 from malfunctioning.

Sixth Embodiment

A semiconductor memory device according to a sixth embodiment will be described below with reference to FIGS. 21 to 24.

The sixth embodiment is a modification example of the second embodiment and the voltage detection circuit 32 periodically samples the power supply voltage VDD. In the following, the sixth embodiment will be described in detail.

In the sixth embodiment, aspects different from the second embodiment will be mainly described, and substantially similar aspects or repeated aspects may be omitted.

Configuration Example of Sixth Embodiment

Figure 21:
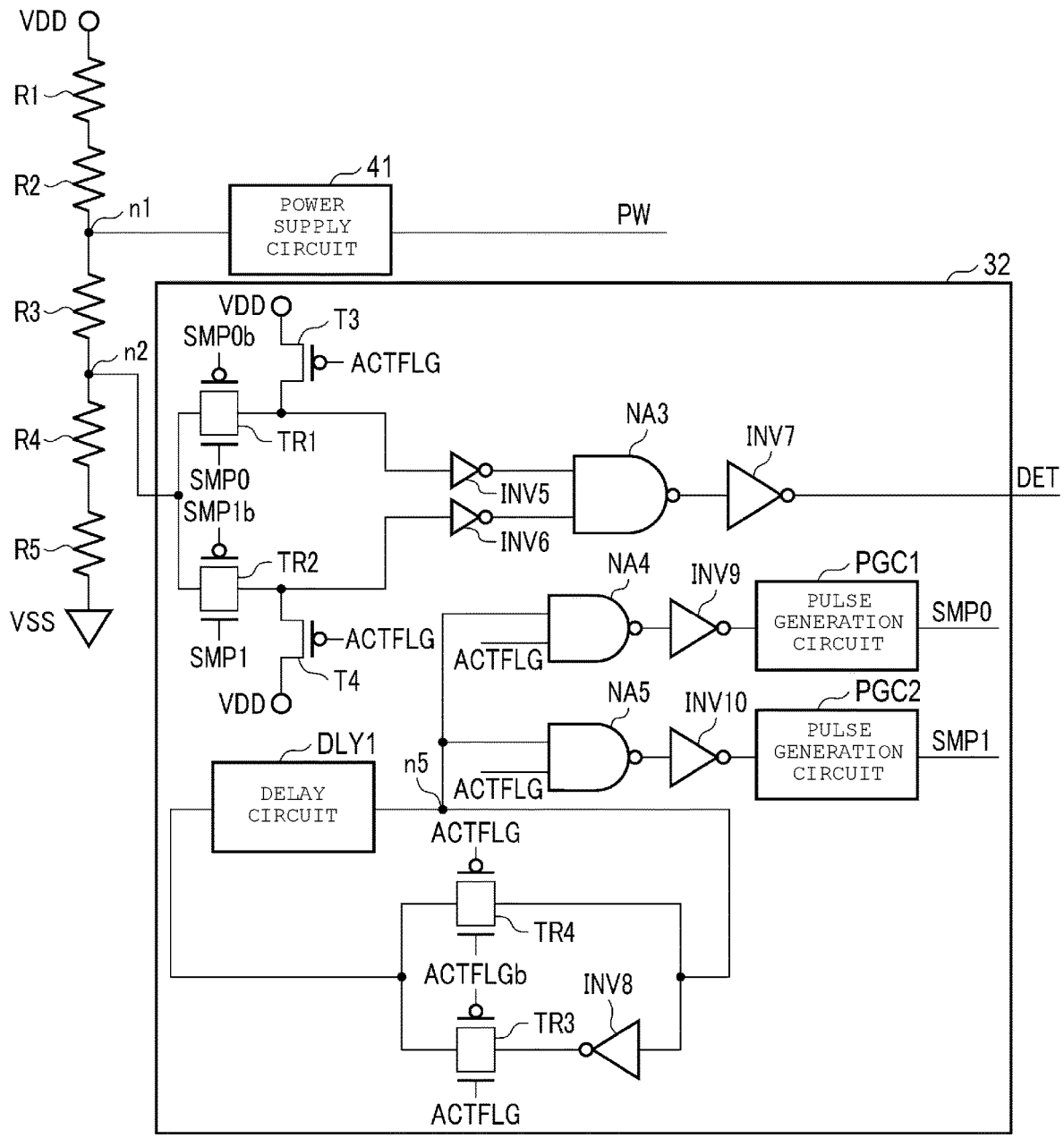
FIG. 21 depicts a voltage detection circuit and a power supply circuit in a semiconductor memory device according to a sixth embodiment.

FIG. 21 is a diagram illustrating the voltage detection circuit 32 and the power supply circuit 41 in the semiconductor memory device according to the sixth embodiment.

As illustrated in FIG. 21, the voltage detection circuit 32 includes transfer gates TR1 to TR4, PMOS transistors T3 and T4, inverters INV5 to INV10, NAND circuits NA3 to NA5, a delay circuit DLY1, and pulse generation circuits PGC1 and PGC2.

The transfer gate TR3 includes a PMOS transistor and an NMOS transistor. A first terminal of the PMOS transistor and a first terminal of the NMOS transistor are electrically connected in common and a second terminal of the PMOS transistor and a second terminal of the NMOS transistor are electrically connected in common. A signal ACTFLGb is supplied to a control terminal of the PMOS transistor and a signal ACTFLG is supplied to a control terminal of the NMOS transistor. A first terminal (first terminals of the PMOS transistor and the NMOS transistor) of the transfer gate TR3 is electrically connected to an input terminal of the delay circuit DLY1.

The transfer gate TR4 includes a PMOS transistor and an NMOS transistor. A first terminal of the PMOS transistor and a first terminal of the NMOS transistor are electrically connected in common and a second terminal of the PMOS transistor and a second terminal of the NMOS transistor are electrically connected in common. The signal ACTFLG is supplied to a control terminal of the PMOS transistor and the signal ACTFLGb is supplied to a control terminal of the NMOS transistor. The first terminal of the transfer gate TR4 is electrically connected to the input terminal of the delay circuit DLY1.

An output terminal of delay circuit DLY1 is electrically connected to a node n5. The node n5 is electrically connected to an input terminal of the inverter INV8. An output terminal of the inverter INV8 is electrically connected to the second terminal (second terminal of PMOS transistor and NMOS transistor) of the transfer gate TR3. The node n5 is electrically connected to the second terminal of the transfer gate TR4.

A first input terminal of the NAND circuit NA4 is electrically connected to the node n5. The active flag signal ACTFLG is supplied to a second input terminal of the NAND circuit NA4. An output terminal of the NAND circuit NA4 is electrically connected to an input terminal of the inverter INV9. An output terminal of the inverter INV9 is electrically connected to an input terminal of the pulse generation circuit PGC1. An output terminal of the pulse generation circuit PGC1 outputs a signal SMP0.

A first input terminal of the NAND circuit NA5 is electrically connected to the node n5. The active flag signal ACTFLG is supplied to a second input terminal of the NAND circuit NA5. An output terminal of the NAND circuit NA5 is electrically connected to an input terminal of the inverter INV10. An output terminal of the inverter INV10 is electrically connected to an input terminal of a pulse generation circuit PGC2. An output terminal of the pulse generation circuit PGC2 outputs a signal SMP1.

The transfer gate TR1 includes a PMOS transistor and an NMOS transistor. A first terminal of the PMOS transistor and a first terminal of the NMOS transistor are electrically connected in common and a second terminal of the PMOS transistor and a second terminal of the NMOS transistor are electrically connected in common. A signal SMP0b is supplied to a control terminal of the PMOS transistor and the signal SMP0 is supplied to a control terminal of the NMOS transistor. A first terminal of the transfer gate TR1 is electrically connected to the node n2. A second terminal of the transfer gate TR1 is electrically connected to the inverter INV5. An output terminal of the inverter INV5 is electrically connected to a first input terminal of the NAND circuit NA3.

A first terminal of the PMOS transistor T3 is electrically connected to the power supply voltage line and a second terminal of the PMOS transistor T3 is electrically connected to the inverter INV5. The active flag signal ACTFLG is supplied to a control terminal of the PMOS transistor T3.

The transfer gate TR2 includes a PMOS transistor and an NMOS transistor. A first terminal of the PMOS transistor and a first terminal of the NMOS transistor are electrically connected in common and a second terminal of the PMOS transistor and a second terminal of the NMOS transistor are electrically connected in common. A signal SMP1b is supplied to a control terminal of the PMOS transistor and the signal SMP1 is supplied to a control terminal of the NMOS transistor. A first terminal of the transfer gate TR2 is electrically connected to the node n2. A second terminal of the transfer gate TR2 is electrically connected to an inverter INV6. An output terminal of the inverter INV6 is electrically connected to a second input terminal of the NAND circuit NA3.

A first terminal of the PMOS transistor T4 is electrically connected to the power supply voltage line and a second terminal of the PMOS transistor T4 is electrically connected to the inverter INV6. The active flag signal ACTFLG is supplied to a control terminal of the PMOS transistor T4.

An output terminal of the NAND circuit NA3 is electrically connected to an input terminal of the inverter INV7. An output terminal of the inverter INV7 outputs the detection signal DET.

Operation Example of Sixth Embodiment

Figure 22:
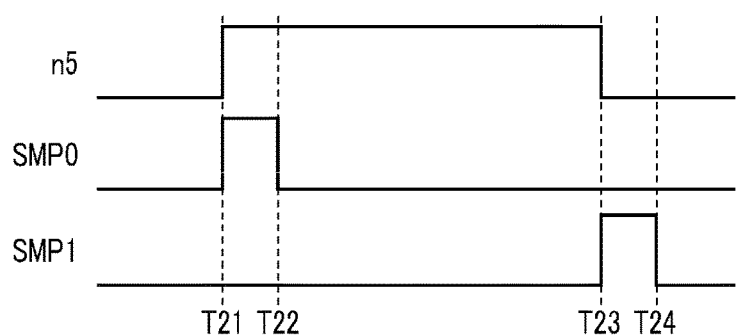
FIG. 22 is a timing chart related to various signals associated with the voltage detection circuit in the semiconductor memory device according to the sixth embodiment.
Figure 23:
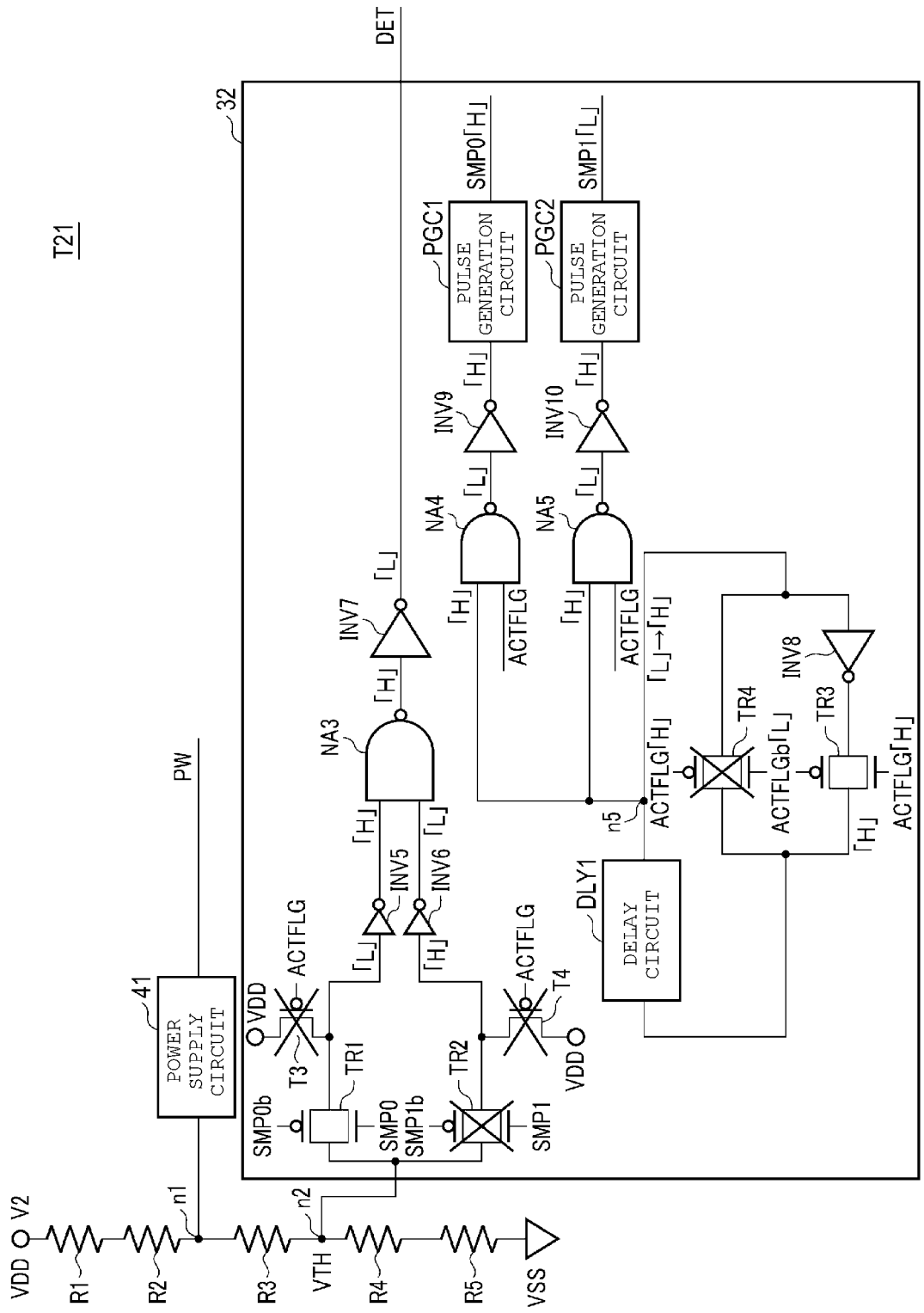
FIG. 23 depicts operational aspects of a voltage detection circuit in a semiconductor memory device according to the sixth embodiment.
Figure 24:
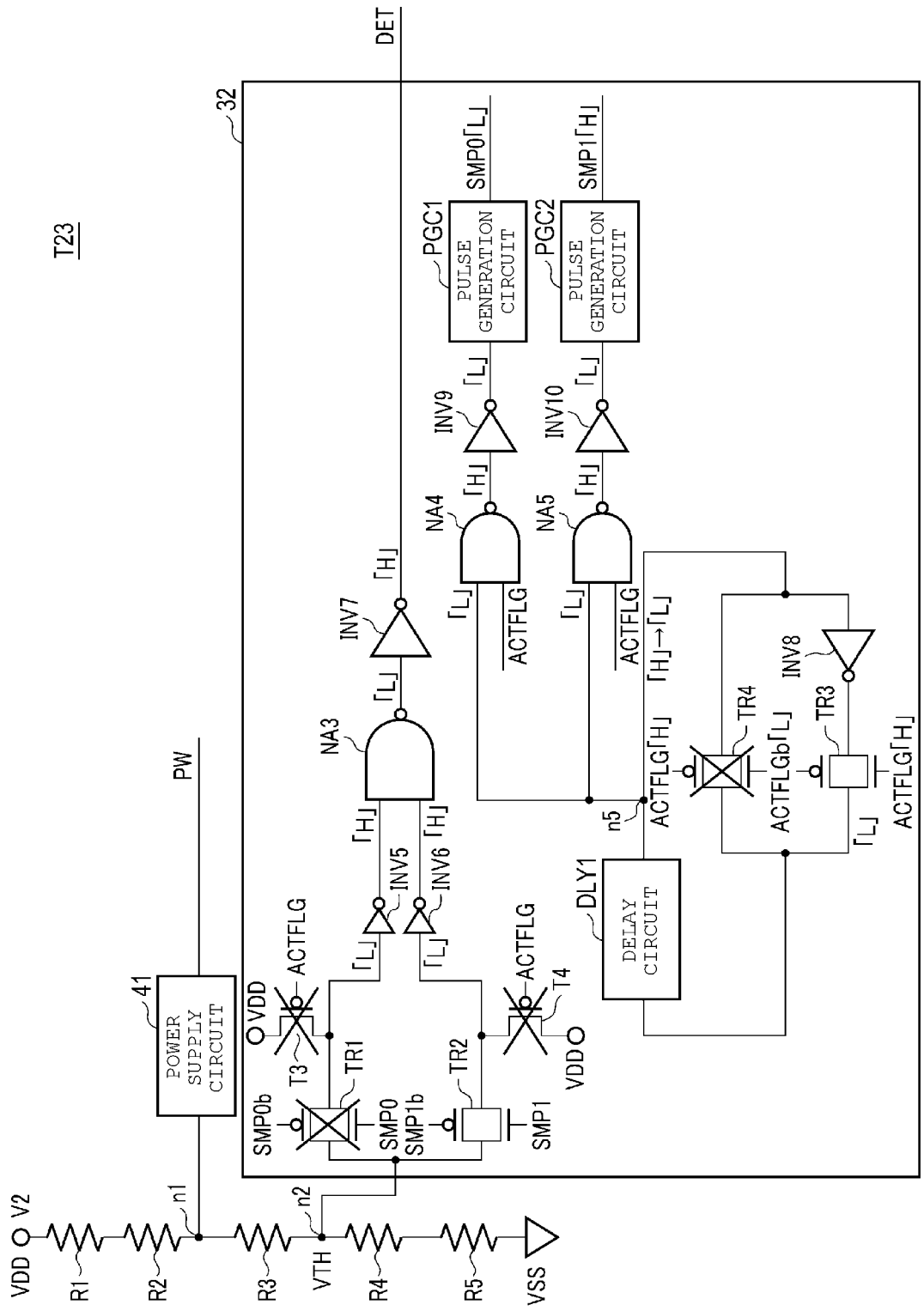
FIG. 24 depicts operational aspects of a voltage detection circuit in a semiconductor memory device according to the sixth embodiment.

FIG. 22 is a diagram illustrating a timing chart of various signals of the voltage detection circuit 32 in the semiconductor memory device according to the sixth embodiment. FIGS. 23 and 24 are diagrams illustrating the operation of the voltage detection circuit 32 in the semiconductor memory device according to the sixth embodiment. More specifically, FIG. 23 illustrates the operation before and after time T21 and FIG. 24 illustrates the operation before and after time T23. Here, the detection operation of the lowering of the power supply voltage VDD by the voltage detection circuit 32 is illustrated.

In the operation example, the voltage detection circuit 32 samples the power supply voltage VDD twice at arbitrary time intervals (periodically) according to the active command. The voltage detection circuit 32 does not set the detection signal DET to the "H" level only by detecting the lowering of the power supply voltage VDD once and sets the detection signal DET to the "H" level if the lowering of the power supply voltage VDD is detected twice. The detection operation of the lowering of the power supply voltage VDD will be described in detail below.

As illustrated in FIG. 22, the node n5 is at the "L" level before time T21. In this case, the active command is not yet received and thus, the active flag ACTFLG becomes "L" level. With this, the transfer gate TR4 is turned ON and the transfer gate TR3 is turned OFF. For that reason, the node n5 maintains the "L" level.

Thereafter, as illustrated in FIG. 22 and FIG. 23, when the active command is received, the active flag ACTFLG becomes the "H" level. With this, the transfer gate TR3 is turned ON and the transfer gate TR4 is turned OFF. The inverter INV8 inverts the "L" level of the node n5 to be output. For that reason, the transfer gate TR3 outputs a signal of "H" level from the inverter INV8. Then, the delay circuit DLY1 delays the signal from the transfer gate TR3 and sets the node n5 to the "H" level at time T21.

When the node n5 becomes the "H" level, the NAND circuit NA4 outputs a signal of "L" level. Accordingly, a signal of "H" level is supplied to the pulse generation circuit PGC1 via the inverter INV9. The pulse generation circuit PGC1 sets the signal SMP0 to the "H" level for a predetermined time (from time T21 to time T22) with the input signal becoming the "H" level as a trigger. With this, the pulse generation circuit PGC1 generates a pulse in the signal SMP0.

When the signal SMP0 becomes the "H" level from time T21 to time T22, the transfer gate TR1 is turned ON and the transfer gate TR2 is turned OFF. In this case, when the power supply voltage VDD is lowered to the second voltage V2, the voltage VTH is applied to the node n2. That is, the transfer gate TR1 transfers the voltage VTH to the inverter INV5. The voltage VTH indicates the "L" level for the inverter INV5. Accordingly, a signal of "H" level is supplied to the first input terminal of the NAND circuit NA3. On the other hand, the voltage VDD ("H" level) is maintained at the input terminal of the inverter INV6. Accordingly, a signal of "L" level is supplied to the second input terminal of the NAND circuit NA3. As a result, the NAND circuit NA3 outputs a signal of "H" level and the detection signal DET becomes the "L" level. That is, when the lowering of the power supply voltage VDD is detected once, the detection signal DET maintains the "L" level.

On the other hand, as illustrated in FIGS. 22 and 24, when the node n5 becomes the "H" level at time T21, the inverter INV8 inverts the "H" level of the node n5 to be output. For that reason, the transfer gate TR3 outputs the signal of "L" level from the inverter INV8. Then, the delay circuit DLY1 delays the signal from the transfer gate TR3 and sets the node n5 to the "L" level at time T23.

When the node n5 becomes the "L" level, the NAND circuit NA5 outputs a signal of "H" level. Accordingly, a signal of "L" level is supplied to the pulse generating circuit PGC2 via the inverter INV9. The pulse generation circuit PGC2 sets the signal SMP1 to the "H" level for a predetermined time (from time T23 to time T24) with the input signal becoming the "L" level as a trigger. With this, the pulse generation circuit PGC1 generates a pulse in the signal SMP1.

When the signal SMP1 goes to the "H" level from time T23 to time T24, the transfer gate TR2 is turned ON and the transfer gate TR1 is turned OFF. In this case, when the power supply voltage VDD is lowered to the second voltage V2, the voltage VTH is applied to the node n2. That is, the transfer gate TR2 transfers the voltage VTH to the inverter INV6. The voltage VTH indicates the "L" level for the inverter INV6. Accordingly, a signal of "H" level is supplied to the second input terminal of the NAND circuit NA3. On the other hand, the "H" level is maintained at the first input terminal of the NAND circuit NA3. As a result, the NAND circuit NA3 outputs a signal of "L" level and the detection signal DET becomes the "H" level. That is, when the lowering of the power supply voltage VDD is detected twice, the detection signal DET becomes the "H" level.

Effect of Sixth Embodiment

According to the sixth embodiment, the voltage detection circuit 32 samples the power supply voltage VDD twice (at first timing and at second timing after the first timing) at arbitrary time intervals. The voltage detection circuit 32 does not set the detection signal DET to the "H" level only by detecting the lowering of the power supply voltage VDD once in two times of sampling. Then, the voltage detection circuit 32 sets the detection signal DET to the "H" level if the lowering of the power supply voltage VDD is detected twice. With this, it is possible to prevent the global light controller 31 from malfunctioning in a case where short-term power-down occurs due to noise or the like.

Although the power supply voltage VDD is sampled twice in this example, the power supply voltage VDD is sampled three or more times without being limited to two sampling times.

Seventh Embodiment

In the following, a semiconductor memory device according to a seventh embodiment will be described with reference to FIGS. 25 to 27.

The seventh embodiment is a modification example of the second embodiment and the voltage detection circuit 32 operates using the same detection node as that of the power supply circuit 41. The seventh embodiment will be described in detail below.

In the seventh embodiment, aspects different from the second embodiment will be mainly described, and substantially similar aspects or repeated aspects may be omitted.

Configuration Example of Seventh Embodiment

Figure 25:
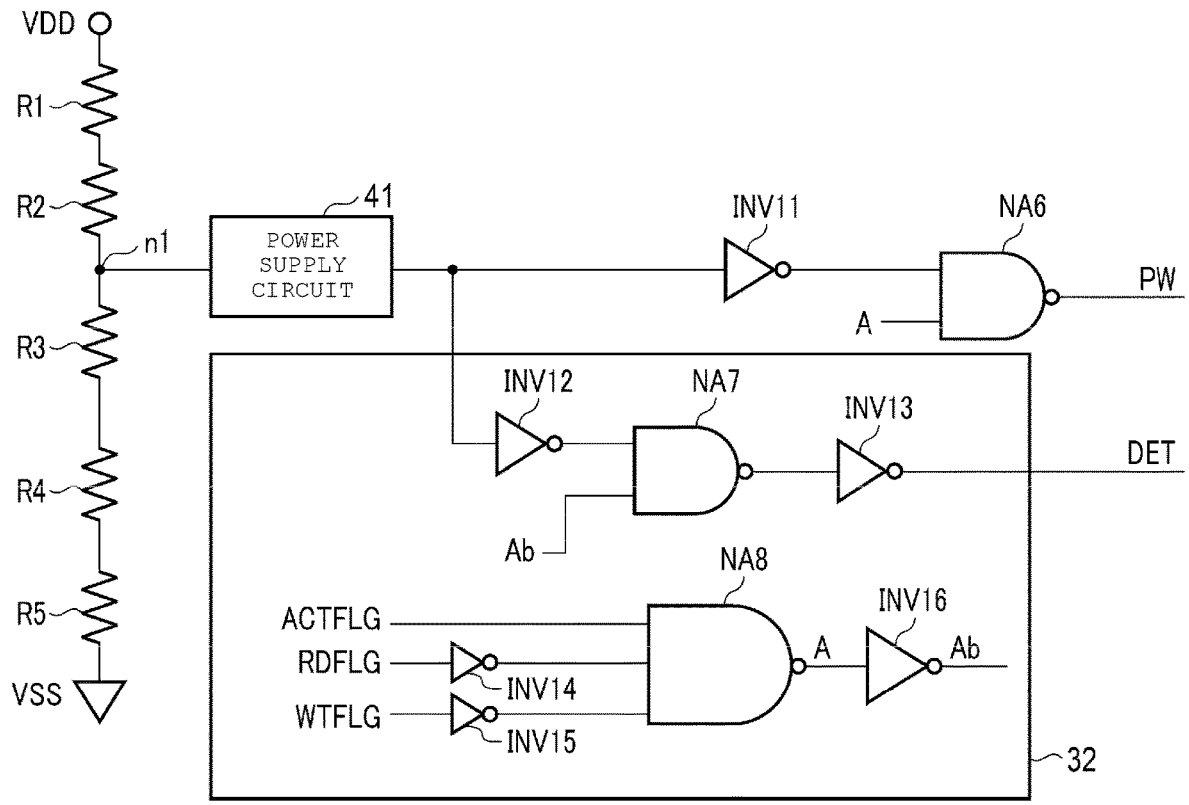
FIG. 25 depicts a voltage detection circuit and a power supply circuit in a semiconductor memory device according to a seventh embodiment.

FIG. 25 is a diagram illustrating the voltage detection circuit 32 and the power supply circuit 41 in the semiconductor memory device according to the seventh embodiment.

As illustrated in FIG. 25, the voltage detection circuit 32 includes NAND circuits NA7 and NA8 and inverters INV12 to INV16.

An active flag signal ACTFLG is supplied to a first input terminal of the NAND circuit NA8. A read flag signal RDFLG is supplied to an input terminal of the inverter INV14. An output terminal of the inverter INV14 is electrically connected to a second input terminal of the NAND circuit NA8. A write flag signal WTFLG is supplied to an input terminal of the inverter INV15. An output terminal of the inverter INV15 is electrically connected to a third input terminal of the NAND circuit NA8. An output terminal of the NAND circuit NA8 outputs a signal A to an input terminal of the inverter INV16. An output terminal of the inverter INV16 outputs a signal Ab.

An input terminal of the inverter INV12 is electrically connected to the output terminal of the power supply circuit 41. An output terminal of the inverter INV12 is electrically connected to a first input terminal of the NAND circuit NA7. The signal Ab is supplied to a second input terminal of the NAND circuit NA7. An output terminal of the NAND circuit NA7 is electrically connected to an input terminal of the inverter INV13. An output terminal of the inverter INV13 outputs a detection signal DET.

On the other hand, the output terminal of the power supply circuit 41 is electrically connected to an input terminal of the inverter INV11. An output terminal of the inverter INV11 is electrically connected to the first input terminal of the NAND circuit NA6. A signal A is supplied to the second input terminal of the NAND circuit NA6. The output terminal of the NAND circuit NA6 outputs a signal PW.

Operation Example of Seventh Embodiment

Figure 26:
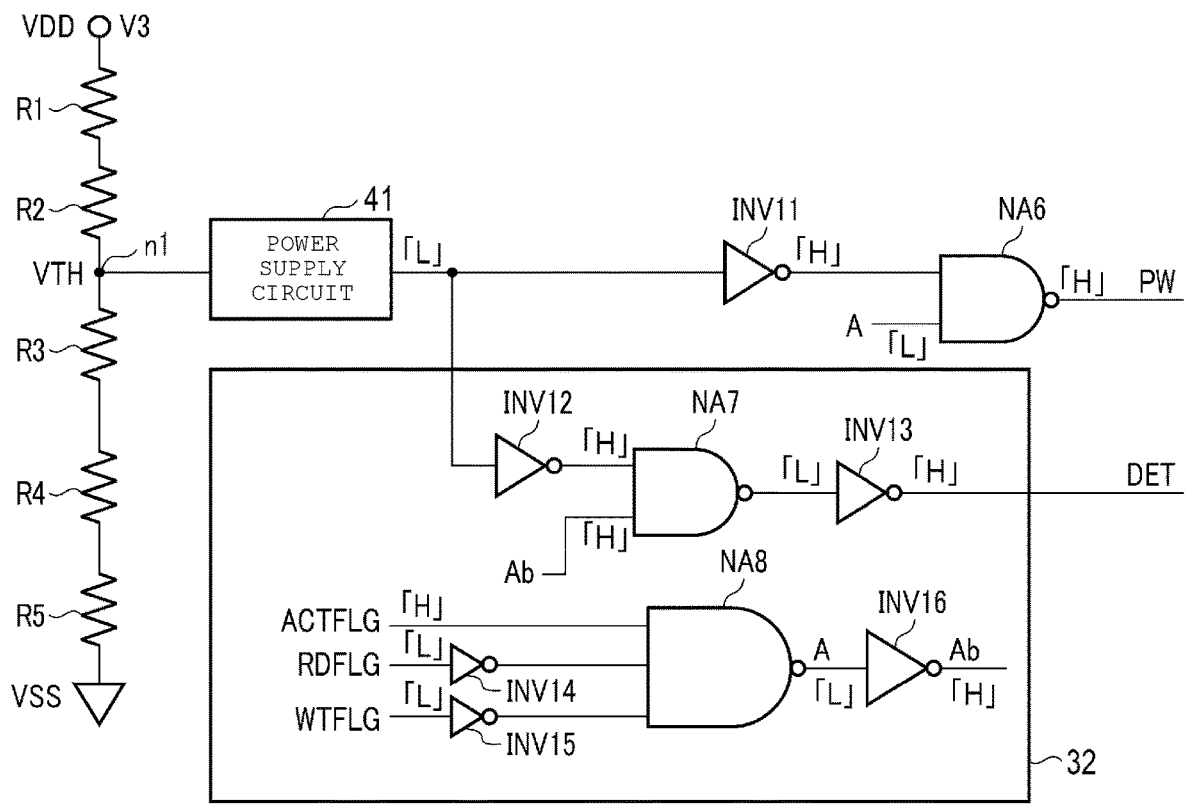
FIG. 26 depicts operational aspects of a voltage detection circuit in a semiconductor memory device according to the seventh embodiment.
Figure 27:
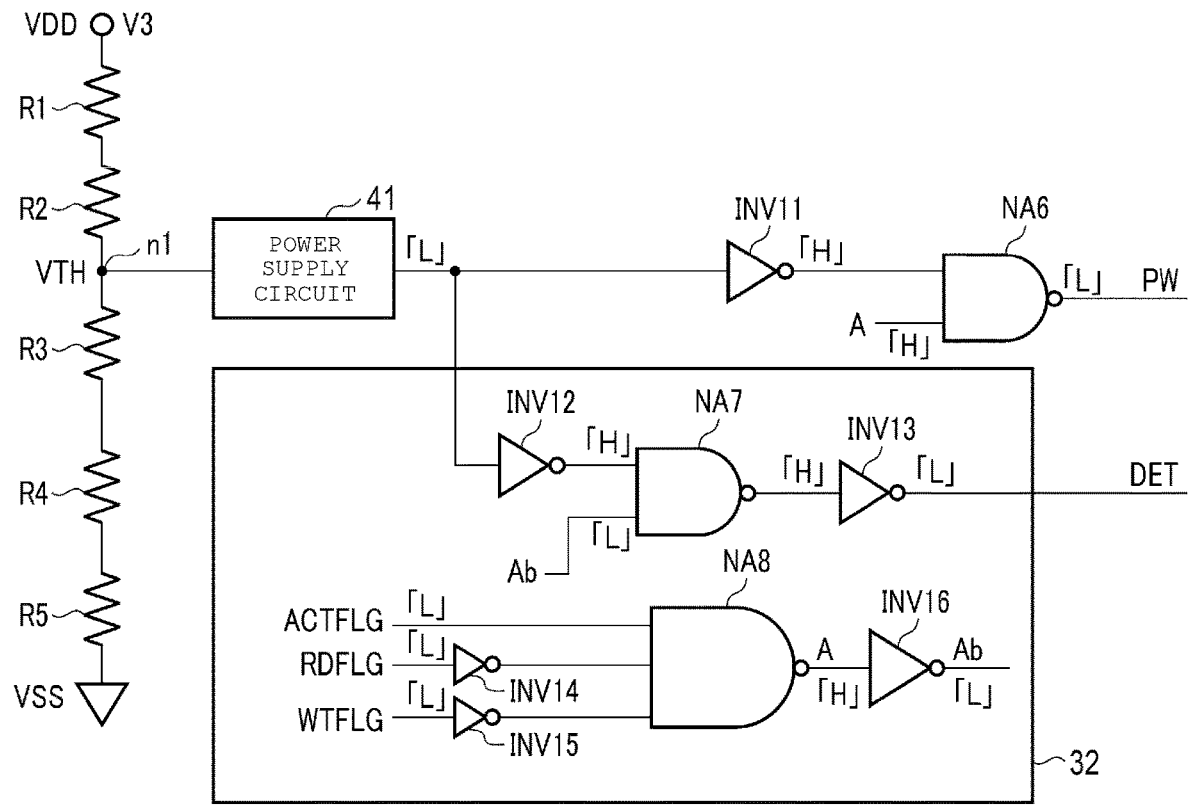
FIG. 27 depicts operational aspects of a voltage detection circuit in a semiconductor memory device according to the seventh embodiment.

FIGS. 26 and 27 are diagrams illustrating the operation of the voltage detection circuit 32 in the semiconductor memory device according to the seventh embodiment. More specifically, FIG. 26 illustrates the operation when the write command and the read command are not received and the active command is received, and FIG. 27 illustrates the operation when the write command and the read command are not received and the active command is not received. Here, a detection operation of the lowering of the power supply voltage VDD by the voltage detection circuit 32 is illustrated.

In the operation example, if the write command and the read command are not received and the active command is received, the voltage detection circuit 32 sets the detection signal DET to the "H" level when the power supply circuit 41 detects the lowering of the power supply voltage VDD.

The detection operation of the lowering of the power supply voltage VDD will be described in detail below.

As illustrated in FIG. 26, when the active command is received, the active flag signal becomes the "H" level. When the write command and the read command are not received, the write flag signal WTFLG and the read flag signal RDFLG become the "L" level. With this, the NAND circuit NA8 outputs the signal A of "L" level. The inverter INV16 outputs the signal Ab of "H" level.

In this case, when the power supply voltage VDD is lowered to a third voltage V3 (which is less than V2), the voltage VTH is applied to the node n1. With this, the power supply circuit 41 outputs the signal of "L" level and the inverter INV12 outputs the signal of "H" level. The signal Ab is at the "H" level and thus, the NAND circuit NA7 outputs a signal of "L" level. Accordingly, the inverter INV13 outputs a detection signal DET of "H" level.

The inverter INV11 outputs the signal of "H" level. The signal A is at the "L" level and thus, the NAND circuit NA6 outputs the signal PW of "H" level. That is, the bank BK is powered on.

On the other hand, as illustrated in FIG. 27, when the active command is not received, the active flag signal becomes the "L" level. When the write command and the read command are not received, the write flag signal WTFLG and the read flag signal RDFLG become the "L" level. With this, the NAND circuit NA8 outputs the signal A of "H" level. The inverter INV16 outputs the signal Ab of "L" level.

In this case, when the power supply voltage VDD is lowered to the third voltage V3, the voltage VTH is applied to the node n1. With this, the power supply circuit 41 outputs the signal of "L" level and the inverter INV12 outputs the signal of "H" level. The signal Ab is at the "L" level and thus, the NAND circuit NA7 outputs a signal of "H" level. Accordingly, the inverter INV13 outputs a detection signal DET of "L" level.

The inverter INV11 outputs a signal of "H" level. The signal A is at the "H" level and thus, the NAND circuit NA6 outputs the signal PW of "L" level. That is, the bank BK is powered off.

Even when the read command is received or the write command is received, the voltage detection circuit 32 operates similarly as when the active command is not received.

Effect of Seventh Embodiment

According to the seventh embodiment, the voltage detection circuit 32 operates using the same detection node as that of the power supply circuit 41. More specifically, if the write command and the read command are not received and the active command is received, the voltage detection circuit 32 sets the detection signal DET to the "H" level when the power supply circuit 41 detects the lowering of the power supply voltage VDD. With this, there is no need to separately provide a detection node at the voltage detection circuit 32 and the power supply circuit 41 and it is possible to make a circuit configuration easier.

Eighth Embodiment

A semiconductor memory device according to an eighth embodiment will be described below with reference to FIGS. 28 to 31.

The eighth embodiment is a modification example of the second embodiment and the voltage detection circuit 32 generates a write pulse based on the detection signal DET. In the following, the eighth embodiment will be described in detail.

In the eighth embodiment, aspects different from the second embodiment will be mainly described, and substantially similar aspects or repeated aspects may be omitted.

Configuration Example of Eighth Embodiment

Figure 28:
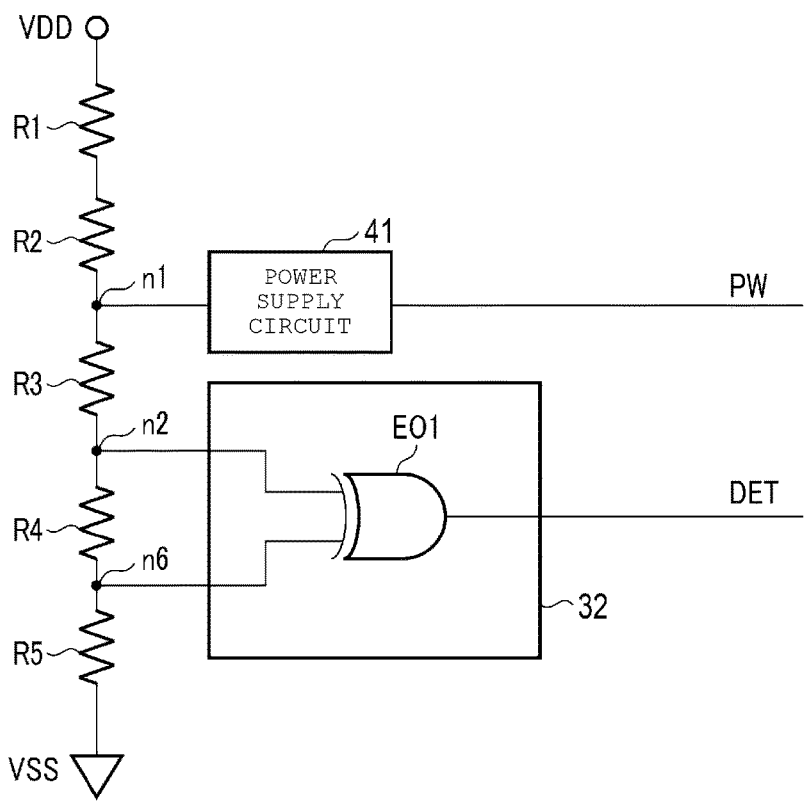
FIG. 28 depicts a voltage detection circuit and a power supply circuit in a semiconductor memory device according to an eighth embodiment.

FIG. 28 is a diagram illustrating the voltage detection circuit 32 and the power supply circuit 41 in the semiconductor memory device according to the eighth embodiment.

As illustrated in FIG. 28, the voltage detection circuit 32 includes an EXOR circuit EO1.

A first input terminal of the EXOR circuit EO1 is electrically connected to a connection terminal (node n2) between the second terminal of a resistor R3 and a first terminal of a resistor R4. A second input terminal of the EXOR circuit EO1 is electrically connected to a connection terminal (node n6) between a second terminal of the resistor R4 and a first terminal of the resistor R5. An output terminal of the EXOR circuit EO1 outputs a detection signal DET.

Operation Example of Eighth Embodiment

Figure 29:
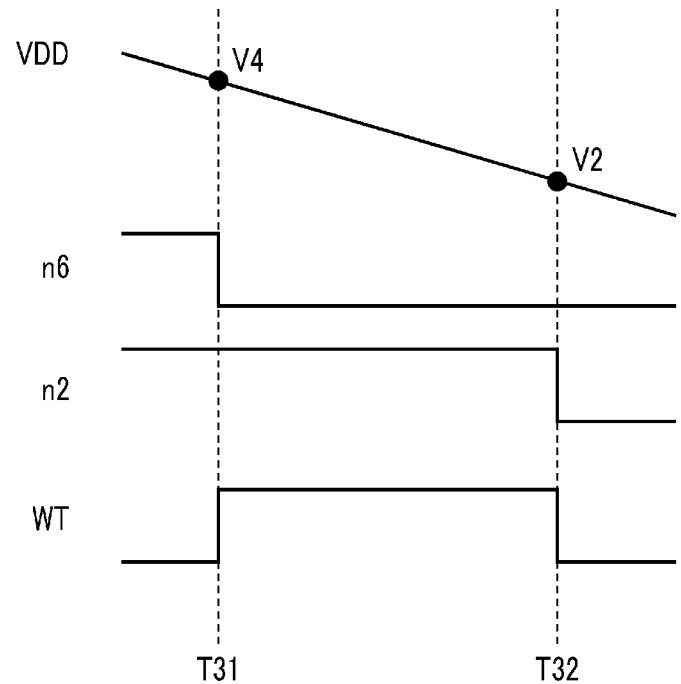
FIG. 29 is a timing chart of various signals associated with the voltage detection circuit in the semiconductor memory device according to the eighth embodiment.
Figure 30:
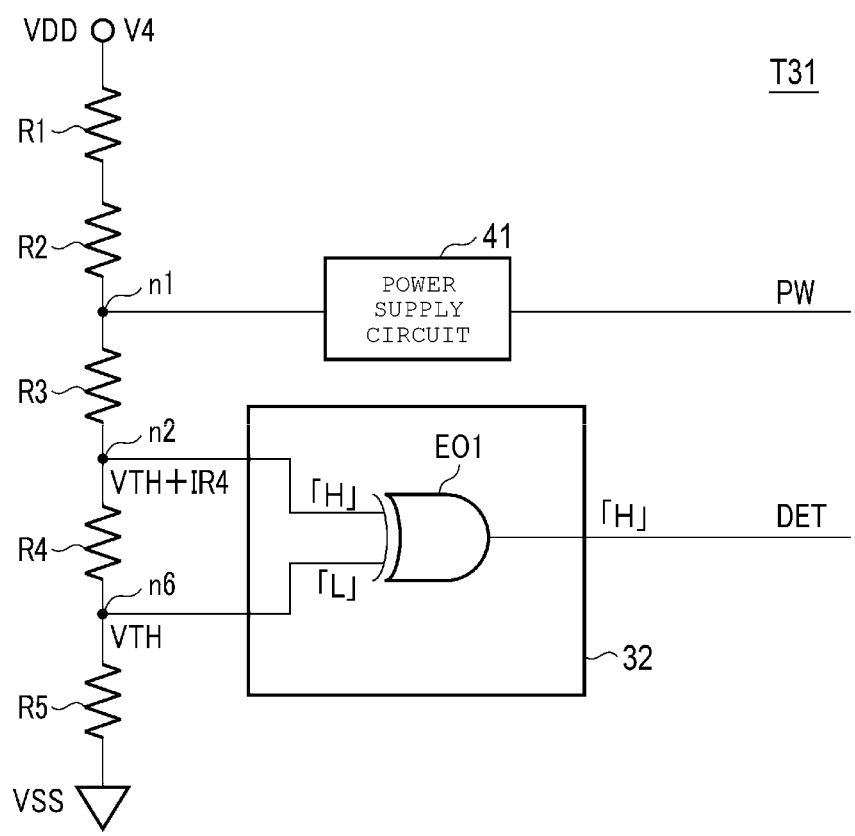
FIG. 30 depicts operational aspects of a voltage detection circuit in a semiconductor memory device according to the eighth embodiment.
Figure 31:
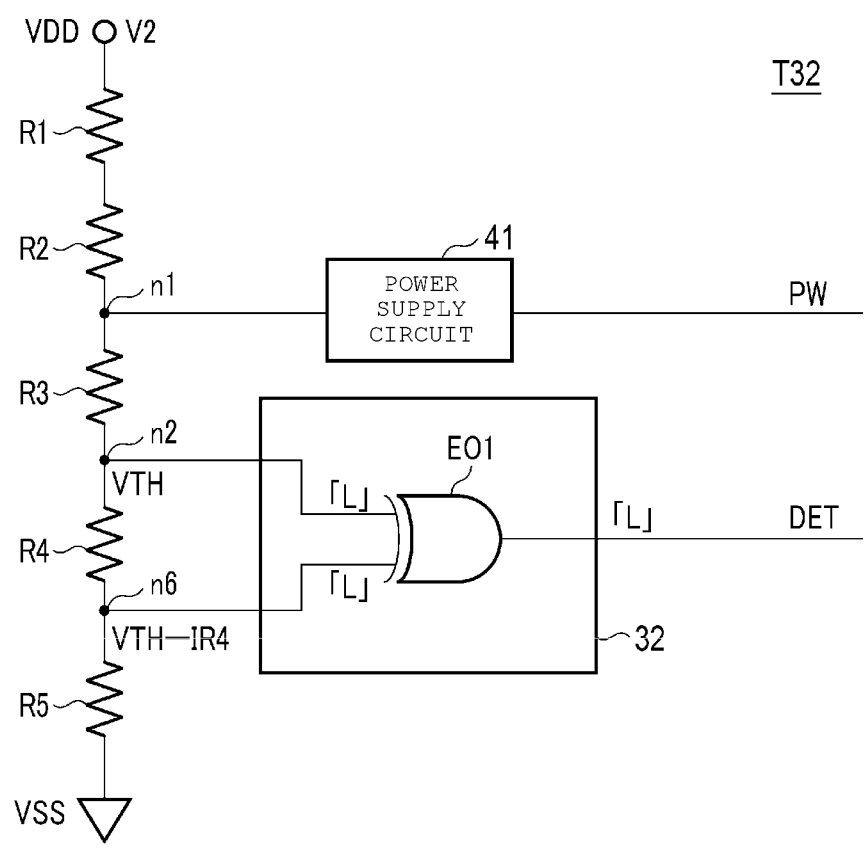
FIG. 31 depicts operational aspects of a voltage detection circuit in a semiconductor memory device according to the eighth embodiment.

FIG. 29 is a timing chart of various signals of the voltage detection circuit 32 in the semiconductor memory device according to the eighth embodiment. FIGS. 30 and 31 are diagrams illustrating the operation of the voltage detection circuit 32 in the semiconductor memory device according to the eighth embodiment. More specifically, FIG. 30 illustrates the operation before and after time T31 and FIG. 31 illustrates the operation before and after time T32. Here, the detection operation of the lowering of the power supply voltage VDD by the voltage detection circuit 32 is illustrated.

In the operation example, the voltage detection circuit 32 detects the lowering of the power supply voltage VDD in two stages. The detection signal DET is set to the "H" level by detecting the lowering of the power supply voltage VDD at a first stage. Thereafter, the detection signal DET is set to the "L" level by detecting the lowering of the power supply voltage VDD at a second stage. With this, a pulse is generated in the detection signal DET and the pulse is used as a write pulse. The detection operation of the lowering of the power supply voltage VDD will be described in detail below.

As illustrated in FIG. 29, before time T31, the power supply voltage VDD is greater than a voltage V4. In this case, the voltages applied to the nodes n2 and n6 are "H" levels for a first input terminal and a second input terminal of the EXOR circuit EO1, respectively. For that reason, the output terminal of the EXOR circuit EO1 outputs a detection signal DET of "L" level.

Next, as illustrated in FIG. 29 and FIG. 30, if the power supply voltage VDD is lowered to the fourth voltage V4 (which is greater than V2, but less than V1) at time T31, the voltage VTH is applied to the node n6. The voltage VTH is "L" level with respect to the second input terminal of the EXOR circuit EO1. On the other hand, a voltage [VTH+I×R4] is applied to the node n2. Here, "I" represents the current flowing in the resistor R4 and R4 represents a resistance value of the resistor R4. The voltage [VTH+I×R4] is the "H" level with respect to the first input terminal of the EXOR circuit EO1. For that reason, the output terminal of the EXOR circuit EO1 outputs a detection signal DET of "H" level.

Thereafter, as illustrated in FIGS. 29 and 31, if the power supply voltage VDD is lowered to the second voltage V2 at time T32, the voltage VTH is applied to the node n2. The voltage VTH is the "L" level with respect to the second input terminal of the EXOR circuit EO1. On the other hand, a voltage [VTH−I×R4] is applied to the node n6. The voltage [VTH−I×R4] is the "L" level with respect to the first input terminal of EXOR circuit EO1. For that reason, the output terminal of the EXOR circuit EO1 outputs a detection signal DET of "L" level.

As described above, as the power supply voltage VDD is lowered, the pulse is generated in the detection signal DET from time T31 to time T32 accompanied by. The voltage detection circuit 32 transmits the detection signal DET to the write driver 23 as a write pulse. The write driver 23 performs writing into the memory cell MC according to the write pulse.

Effect of Eighth Embodiment

According to the seventh embodiment, the voltage detection circuit 32 generates the write pulse by the detection signal DET. More specifically, the voltage detection circuit 32 detects the lowering of the power supply voltage VDD in two stages. The detection signal DET is set to the "H" level by detecting the lowering of the power supply voltage VDD at the first stage. Thereafter, the detection signal DET is set to the "L" level by detecting the lowering of the power supply voltage VDD at the second stage. With this, a pulse is generated in the detection signal DET and the write driver 23 uses the pulse as the write pulse. Accordingly, the global write controller 31 may not be provided and expansion of the circuit area can be minimized.

Ninth Embodiment

A semiconductor memory device according to a ninth embodiment will be described below with reference to FIGS. 32 to 36.

The ninth embodiment is a modification example of the second embodiment and trims a detection level by the voltage detection circuit 32. In the following, the ninth embodiment will be described in detail.

In the ninth embodiment, aspects different from the second embodiment will be mainly described, and substantially similar aspects or repeated aspects may be omitted.

Configuration Example of Ninth Embodiment

Figure 32:
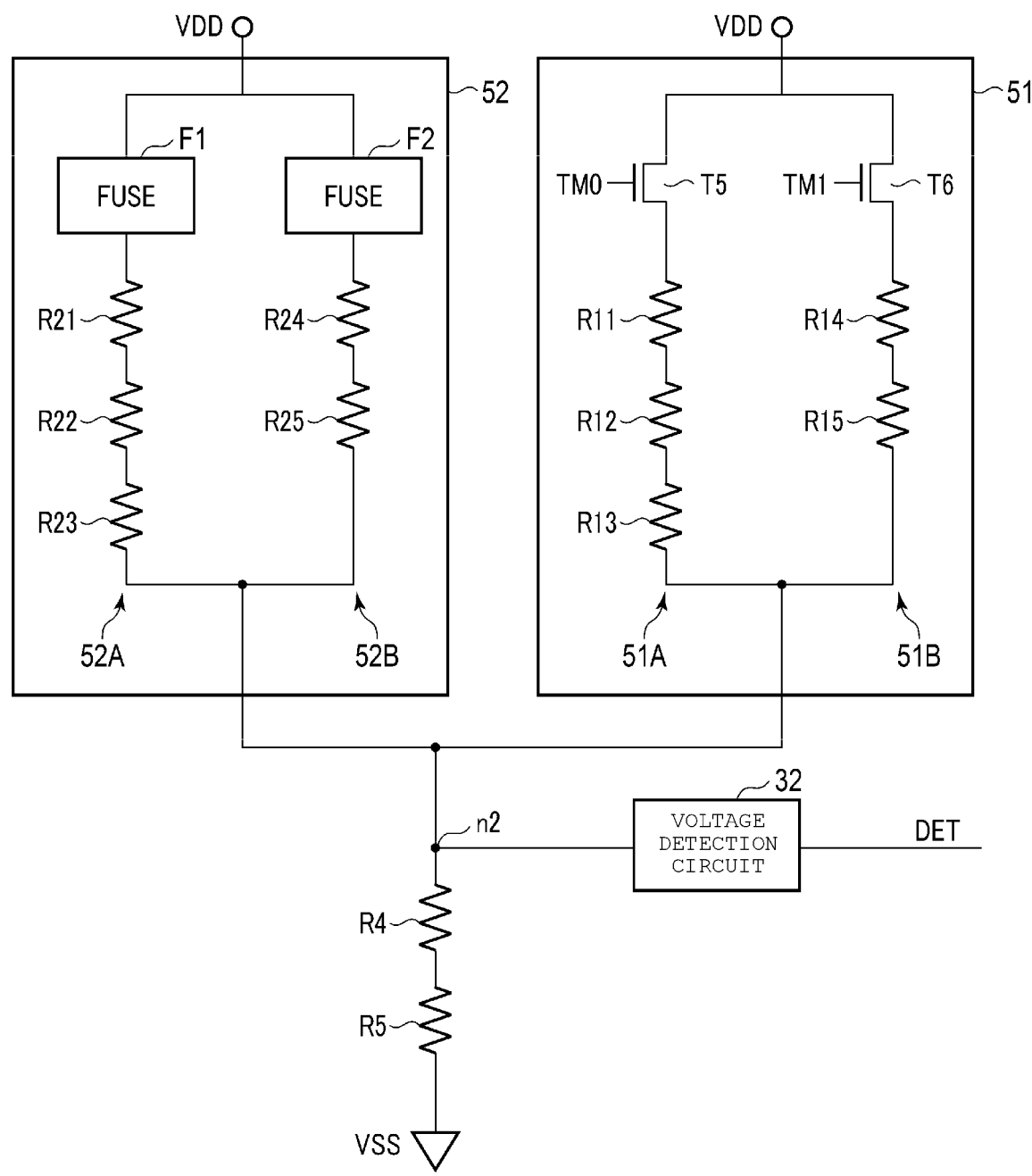
FIG. 32 depicts a voltage detection circuit, a test mode circuit, and a trimming circuit in a semiconductor memory device according to a ninth embodiment.

FIG. 32 is a diagram illustrating the voltage detection circuit 32, a test mode circuit 51, and a trimming circuit 52 in the semiconductor memory device according to the ninth embodiment.

As illustrated in FIG. 32, the test mode circuit 51 is electrically connected between a power supply voltage line and a first terminal of the resistor R4. The test mode circuit 51 includes series circuits 51A and 51B. The series circuits 51A and 51B are electrically connected in parallel to each other.

The series circuit 51A includes a transistor T5 and resistors R11 to R12. The transistor T5 and resistors R11 to R12 are electrically connected in series between the power supply voltage line and the first terminal of resistor R4. That is, a first terminal of the transistor T5 is electrically connected to the power supply voltage line and a second terminal of the transistor T5 is electrically connected to a first terminal of the resistor R11. A second terminal of the resistor R11 is electrically connected to a first terminal of the resistor R12. A second terminal of the resistor R12 is electrically connected to a first terminal of the resistor R13. A second terminal of the resistor R13 is electrically connected to the first terminal of the resistor R4 and the voltage detection circuit 32. A control terminal of the transistor T5 is electrically connected to a control line TM0.

The series circuit 51B includes a transistor T6 and resistors R14 and R15. The transistors T6 and the resistors R14 and R15 are electrically connected in series between the power supply voltage line and the first terminal of resistor R4. That is, a first terminal of the transistor T6 is electrically connected to the power supply voltage line and a second terminal of the transistor T6 is electrically connected to a first terminal of the resistor R14. A second terminal of the resistor R14 is electrically connected to a first terminal of the resistor R15. A second terminal of the resistor R15 is electrically connected to the first terminal of the resistor R4 and the voltage detection circuit 32. A control terminal of the transistor T6 is electrically connected to a control line TM1.

The trimming circuit 52 is electrically connected between the power supply voltage line and the first terminal of the resistor R4. The trimming circuit 52 includes series circuits 52A and 52B. The series circuits 52A and 52B are electrically connected in parallel to each other.

The series circuit 52A includes a fuse F1 and resistors R21 to R23. The fuse F1 and the resistors R21 to R23 are electrically connected in series between the power supply voltage line and the first terminal of the resistor R4. That is, a first terminal of the fuse F1 is electrically connected to the power supply voltage line and a second terminal of the fuse F1 is electrically connected to a first terminal of the resistor R21. A second terminal of the resistor R21 is electrically connected to a first terminal of the resistor R22. A second terminal of the resistor R22 is electrically connected to a first terminal of the resistor R23. A second terminal of the resistor R23 is electrically connected to the first terminal of the resistor R4 and the voltage detection circuit 32.

The series circuit 52B includes a fuse F2 and resistors R24 and R25. The fuse F2 and the resistors R24 and R25 are electrically connected in series between the power supply voltage line and the first terminal of the resistor R4. That is, a first terminal of the fuse F2 is electrically connected to the power supply voltage line and a second terminal of the fuse F2 is electrically connected to a first terminal of the resistor R24. A second terminal of the resistor R24 is electrically connected to a first terminal of the resistor R25. A second terminal of the resistor R25 is electrically connected to the first terminal of the resistor R4 and the voltage detection circuit 32.

Operation Example of Ninth Embodiment

Figure 33:
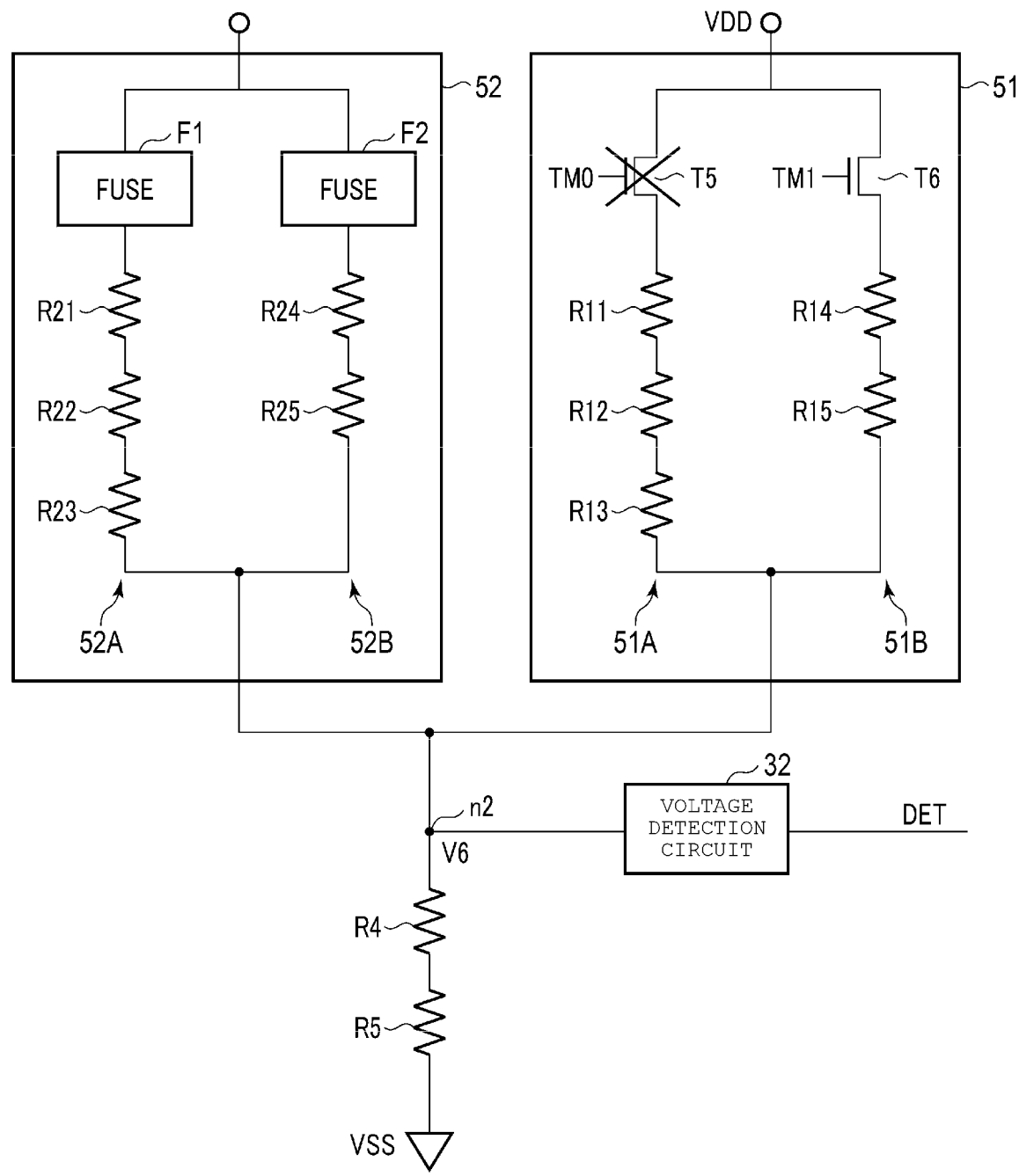
FIG. 33 is a diagram illustrating aspects of a test mode of voltage detection in the semiconductor memory device according to the ninth embodiment.
Figure 34:
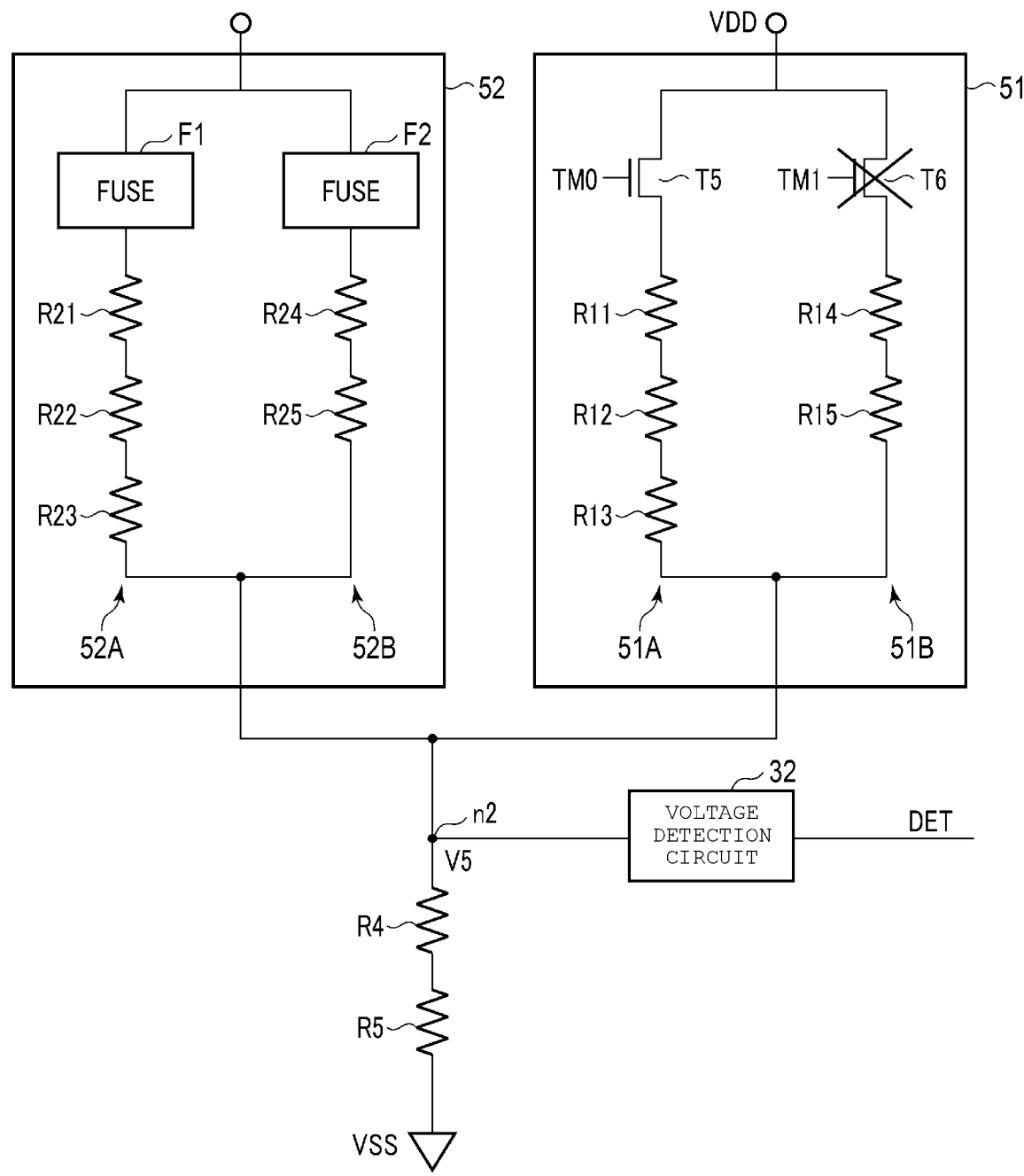
FIG. 34 is another diagram illustrating aspects of the test mode of voltage detection in the semiconductor memory device according to the ninth embodiment.
Figure 35:
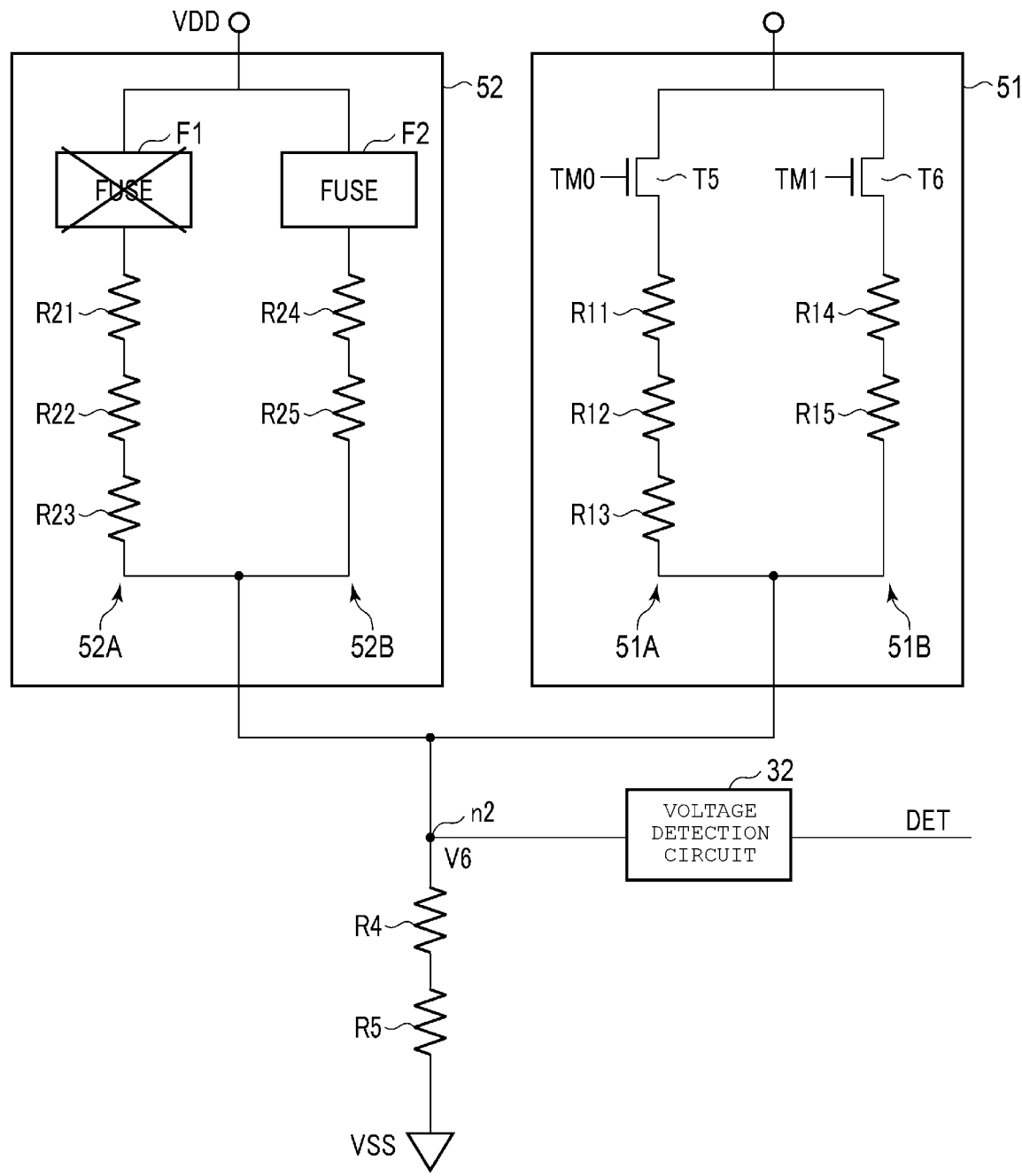
FIG. 35 is a diagram illustrating aspects of trimming of voltage detection in the semiconductor memory device according to the ninth embodiment.
Figure 36:
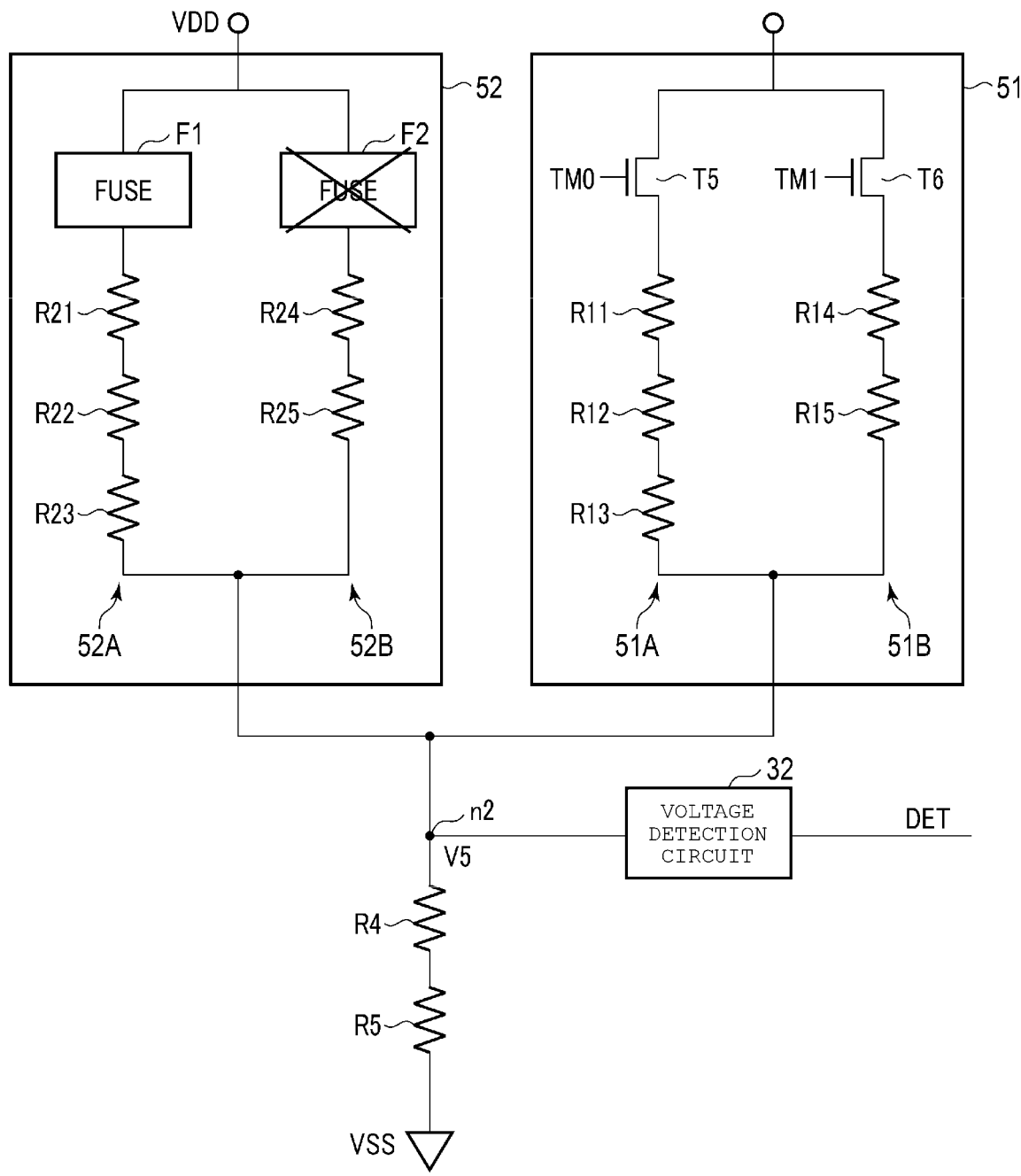
FIG. 36 is another diagram illustrating aspects of trimming of voltage detection in the semiconductor memory device according to the ninth embodiment.

FIGS. 33 and 34 are diagrams illustrating a test mode of voltage detection in the semiconductor memory device according to the ninth embodiment. FIGS. 35 and 36 are diagrams illustrating trimming of voltage detection in the semiconductor memory device according to the ninth embodiment.

In the operation example, first, in the test mode, an actual detection level by the voltage detection circuit 32 is determined. Then, a detection level of the voltage detection circuit 32 is trimmed to a desired detection level based on a determination result in the test mode. In the following, the test mode and trimming will be described in detail.

In the test mode, the test mode circuit 51 operates. First, as illustrated in FIG. 33, the transistor T6 is turned ON and the transistor T5 is turned OFF. In this case, the voltage of the node n2 becomes a voltage V6 generated by the series circuit 51B (resistors R14 and R15), and the voltage V6 is supplied to the voltage detection circuit 32. In this case, when the voltage detection circuit 32 sets the detection signal DET to the "H" level, it is determined that the detection level of the voltage detection circuit 32 is less than or equal to the voltage V6.

On the other hand, when the voltage detection circuit 32 sets the detection signal DET to the "L" level, the test mode is continued. Next, as illustrated in FIG. 34, the transistor T5 is turned ON and the transistor T6 is turned OFF. In this case, the voltage at the node n2 becomes a voltage V5 (which is greater than V6) generated by the series circuit 51A (resistors R11 to R13), and the voltage V5 is supplied to the voltage detection circuit 32. In this case, if the voltage detection circuit 32 sets the detection signal DET to the "H" level, it is determined that the detection level of the voltage detection circuit 32 is less than or equal to the voltage V5.

Trimming of the detection level is performed based on the determination result in the test mode. The trimmed detection level is stored by the trimming circuit 52.

For example, if the detection level determined by the test mode is the voltage V6, the fuse F1 is disconnected as illustrated in FIG. 35 when the detection level is the optimum value. With this, the voltage of the node n2 becomes the voltage V6 generated by the series circuit 52B (resistors R24 and R25). In an actual detection operation, the voltage detection circuit 32 operates so as to detect the voltage V6.

On the other hand, if the detection level determined by the test mode is the voltage V6, the fuse F2 is disconnected as illustrated in FIG. 36 when the detection level is higher than the desired level. With this, the voltage of the node n2 becomes the voltage V5 generated by the series circuit 52A (resistors R21 to R23). In the actual detection operation, the voltage detection circuit 32 operates so as to detect the voltage V5.

Whether the detection level determined by the test mode is optimum or not is determined by, for example, whether the determined detection level is lower than a lower limit of a specification power supply or not. That is, the detection level is set to be lower than the lower limit of specification power by trimming.

In the test mode and trimming, two series circuits are used, respectively, but the present disclosure is not limited thereto. The test mode and trimming may also be performed respectively using three or more series circuits.

Effects of Ninth Embodiment

Even when the same node is used as the detection node by the voltage detection circuit 32, the detection level changes depending on various conditions. For that reason, even when a level of the power supply voltage VDD is within a range of the specification power supply, the voltage detection circuit 32 may detect the lowering of the power supply voltage VDD and malfunction may occur.

In contrast, according to the ninth embodiment, the actual detection level by the voltage detection circuit 32 is determined in the test mode. The detection level by the voltage detection circuit 32 is trimmed to a desired detection level based on the determination result in the test mode. With this, the detection level of the voltage detection circuit 32 can be set to the optimum level and malfunction of the voltage detection circuit 32 can be prevented.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a first memory cell with a first variable resistance element;
a first write controller circuit configured to write data into the first memory cell using a first voltage that is supplied via a first wiring;
a second write controller circuit different from the first write controller circuit and configured to write data into the first memory cell using a second voltage that is lower than the first voltage when the first voltage supplied via the first wiring is reduced below a threshold level;
a first circuit that controls operation of the second write controller circuit according to a first signal that is supplied based on a voltage of the first wiring; and
a second circuit that supplies the voltage of the first wiring to the first memory cell according to a second signal that is supplied based on the voltage of the first wiring.

2. The semiconductor memory device according to claim 1, wherein
the first write controller circuit performs writing of data into the first memory cell with a first writing time, and
the second write controller circuit performs writing of data into the first memory cell with a second writing time that is longer than the first writing time.

3. The semiconductor memory device according to claim 1, wherein
the voltage of the first wiring that causes the first signal to be supplied is lower than the voltage of the first wiring that cause the second signal to be supplied.

4. The semiconductor memory device according to claim 1, wherein the first circuit includes:
a third circuit configured to generate a different voltage depending on temperature, and
a comparator having a first input terminal to which a third signal based on the voltage of the first wiring is supplied and a second input terminal to which a fourth signal based on the voltage generated by the third circuit is supplied.

5. The semiconductor memory device according to claim 1, wherein the first circuit includes a NAND circuit having a first input terminal to which a fifth signal based on the voltage of the first wiring is supplied and a second terminal to which a sixth signal is supplied.

6. The semiconductor memory device according to claim 5, wherein the sixth signal is a signal based on receipt of an active command.

7. The semiconductor memory device according to claim 5, wherein the sixth signal is a signal based on receipt of a write command.

8. The semiconductor memory device according to claim 5, wherein the sixth signal is a signal based on receipt of a read command.

9. The semiconductor memory device according to claim 1, wherein the first circuit includes:
a NAND circuit having a first input terminal to which a seventh signal based on the voltage of the first wiring is supplied and a second input terminal to which an eighth signal based on the voltage of first wiring is supplied, the seventh signal changing from a first logic level to a second logic level at a first time, and the eighth signal changing from the first logic level to the second logic level at a second time after the first time.

10. The semiconductor memory device according to claim 1, wherein the first circuit includes:

a first NAND circuit having a first input terminal to which a ninth signal based on the voltage supplied of first wiring is supplied and a second input terminal to which a tenth signal is supplied, and a second NAND circuit that having a first input terminal to which the ninth signal is supplied and a second terminal to which an eleventh signal having a logic level different from that of the tenth signal is supplied.

11. The semiconductor memory device according to claim 10, wherein the tenth signal is a signal based receipt of an active command.

12. The semiconductor memory device according to claim 10, wherein the tenth signal is a signal based on receipt of a write command.

13. The semiconductor memory device according to claim 10, wherein the tenth signal is a signal based on receipt of a read command.

14. The semiconductor memory device according to claim 1, further comprising:

a fourth circuit connected in series between the first wiring and the first circuit; and a fifth circuit connected in series between the first wiring and the first circuit, the fifth circuit being connected in parallel with the fourth circuit.

15. The semiconductor memory device according to claim 14, wherein the fourth circuit includes:

a first transistor and a first resistor connected in series, and a second transistor and a second resistor connected in series;

the fifth circuit includes:

a first fuse and a third resistor connected in series, and a second fuse and a fourth resistor connected in series; and a resistance value of the first resistor is different from a resistance of the second resistor and a resistance value of the third resistor is different from a resistance of the fourth resistor.

16. A semiconductor memory device, comprising:

a first memory cell with a first variable resistance element;

a first write controller circuit configured to write data into the first memory cell using a first voltage that is supplied via a first wiring;

a second write controller circuit different from the first write controller circuit and configured to write data into the first memory cell using a second voltage that is lower than the first voltage when the first voltage supplied via the first wiring is reduced below a threshold level;

a first circuit that controls operation of the second write controller circuit according to a first signal that is supplied based on a voltage of the first wiring; and a second circuit that supplies the voltage of the first wiring to the first memory cell according to a second signal that is supplied based on the voltage of the first wiring, wherein the voltage of the first wiring that causes the first signal to be supplied is lower than the voltage of the first wiring that cause the second signal to be supplied.

17. The semiconductor memory device according to claim 16, wherein the first circuit includes a NAND circuit having a first input terminal to which a fifth signal based on the voltage of the first wiring is supplied and a second terminal to which a sixth signal is supplied.

* * * * *